US012660403B2

(12) United States Patent
Ishikawa et al.

(10) Patent No.: US 12,660,403 B2
(45) Date of Patent: Jun. 16, 2026

(54) LIGHT-EMITTING DEVICE AND LIGHT-EMITTING MODULE

(71) Applicant: NICHIA CORPORATION, Anan (JP)

(72) Inventors: Tetsuya Ishikawa, Komatsushima (JP); Yuta Oka, Awa (JP)

(73) Assignee: NICHIA CORPORATION, Anan (JP)

( * ) Notice: Subject to any disclaimer, the term of this patent is extended or adjusted under 35 U.S.C. 154(b) by 526 days.

(21) Appl. No.: 18/299,168

(22) Filed: Apr. 12, 2023

(65) Prior Publication Data

US 2023/0352458 A1     Nov. 2, 2023

(30) Foreign Application Priority Data

Apr. 28, 2022     (JP) ................................. 2022-074306

(51) Int. Cl.
H10H 29/14          (2025.01)
H10H 29/80          (2025.01)
(Continued)

(52) U.S. Cl.
CPC ........ H10H 29/142 (2025.01); H10H 29/856 (2025.01); H10H 29/882 (2025.01); (Continued)

(58) Field of Classification Search
CPC ....... H01L 25/0753; H01L 2224/32225; H01L 2224/32059; H01L 2224/2919; H01L 2224/29017; H01L 24/32; H01L 24/29; H01L 20/882; H01L 29/882; H10H 20/856; H10H 29/856; H10H 20/882; H10H 29/882
See application file for complete search history.

(56) References Cited

U.S. PATENT DOCUMENTS

2008/0290351 A1    11/2008  Ajiki et al.
2012/0044669 A1*    2/2012  Ogata ....................... F21K 9/90
                                                               362/97.3
(Continued)

FOREIGN PATENT DOCUMENTS

JP          2008-294224 A      12/2008
JP          2015-512559 A       4/2015
(Continued)

*Primary Examiner* — Eliseo Ramos Feliciano
*Assistant Examiner* — Adam Joseph Mott
(74) *Attorney, Agent, or Firm* — Foley & Lardner LLP

(57)     ABSTRACT

A light-emitting device includes: a light source including: a first light source part including one or more first light-emitting elements, and a second light source part located outward of the first light source part so as to surround the first light source part in a top view, the second light source part including a plurality of second light-emitting elements; one or more first light-transmitting layers located above the first light source part; one or more second light-transmitting layers located above the second light source part; and a light-reflective member located between the plurality of second light-emitting elements. A first of the one or more second light-transmitting layers overlaps adjacent second light-emitting elements among the plurality of second light-emitting elements and the light-reflective member disposed between the adjacent second light-emitting elements in a top view.

16 Claims, 13 Drawing Sheets

(51) Int. Cl.

| | |
|---|---|
| *H10H 29/856* | (2025.01) |
| *H10W 90/00* | (2026.01) |
| *H10H 29/01* | (2025.01) |
| *H10H 29/851* | (2025.01) |
| *H10H 29/854* | (2025.01) |
| *H10W 72/00* | (2026.01) |
| *H10W 72/30* | (2026.01) |

(52) U.S. Cl.
CPC ......... *H10H 29/011* (2025.01); *H10H 29/036* (2025.01); *H10H 29/0361* (2025.01); *H10H 29/0363* (2025.01); *H10H 29/851* (2025.01); *H10H 29/8516* (2025.01); *H10H 29/854* (2025.01); *H10W 72/07353* (2026.01); *H10W 72/334* (2026.01); *H10W 72/354* (2026.01); *H10W 90/734* (2026.01)

(56) References Cited

U.S. PATENT DOCUMENTS

| | | | |
|---|---|---|---|
| 2015/0049502 A1 | 2/2015 | Brandl et al. | |
| 2015/0340575 A1 | 11/2015 | Nakabayashi et al. | |
| 2016/0148912 A1 | 5/2016 | Higashino | |
| 2016/0372515 A1 | 12/2016 | Miyoshi et al. | |
| 2017/0062681 A1* | 3/2017 | Miyoshi | H10H 20/8514 |
| 2017/0103971 A1* | 4/2017 | Tamura | H01L 25/0753 |
| 2017/0125653 A1* | 5/2017 | Kawano | H10H 20/855 |
| 2018/0175239 A1* | 6/2018 | Hayashi | H10H 20/01 |
| 2018/0266639 A1 | 9/2018 | Maeno et al. | |
| 2018/0372291 A1* | 12/2018 | Wada | F21S 41/141 |
| 2019/0067542 A1* | 2/2019 | Nakabayashi | H10H 20/857 |
| 2019/0081202 A1* | 3/2019 | Kasai | H10H 20/01 |
| 2019/0237441 A1* | 8/2019 | Higashisaka | H01L 23/544 |
| 2020/0028035 A1 | 1/2020 | Van Der Sijde et al. | |
| 2021/0242366 A1* | 8/2021 | Kim | H10H 20/819 |

FOREIGN PATENT DOCUMENTS

| | | | | |
|---|---|---|---|---|
| JP | 2016-100457 A | | 5/2016 | |
| JP | 2016219485 A | * | 12/2016 | |
| JP | 2017-011259 A | | 1/2017 | |
| JP | 2019-009223 A | | 1/2019 | |
| JP | 2019-046929 A | | 3/2019 | |
| JP | 2019-054073 A | | 4/2019 | |
| JP | 2019-132893 A | | 8/2019 | |
| JP | 2019-192703 A | | 10/2019 | |
| JP | 2020-021936 A | | 2/2020 | |
| JP | 2020-057673 A | | 4/2020 | |
| JP | 2020-074490 A | | 5/2020 | |
| KR | 20150083248 A | * | 7/2015 | H10H 20/855 |
| KR | 20200132154 A | * | 11/2020 | H10H 20/8512 |
| WO | WO-2017/082184 A1 | | 5/2017 | |
| WO | WO-2021261567 A1 | * | 12/2021 | H10H 20/855 |

* cited by examiner

LIGHT-EMITTING DEVICE AND LIGHT-EMITTING MODULE

CROSS-REFERENCE TO RELATED APPLICATION

This application claims priority to Japanese Patent Application No. 2022-074306, filed on Apr. 28, 2022, the disclosure of which is hereby incorporated by reference in its entirety.

BACKGROUND

The present disclosure relates to a light-emitting device and a light-emitting module.

For example, Japanese Patent Publication No. 2016-100457 discloses a light-emitting device that includes a plurality of light-emitting elements arranged in a matrix configuration on a substrate.

SUMMARY

Embodiments according to the disclosure are directed to a light-emitting device and a light-emitting module that can reduce uneven irradiation due to dark portions between adjacent light-emitting elements.

According to an embodiment of the present disclosure, a light-emitting device includes a light source including a first light source part including at least one first light-emitting element, and a second light source part located outward of the first light source part to surround the first light source part in a top view, the second light source part including a plurality of second light-emitting elements that emit light collectively; at least one first light-transmitting layer located above the first light source part; at least one second light-transmitting layer located above the second light source part; and a light-reflective member located between the plurality of second light-emitting elements, wherein one second light-transmitting layer among the at least one second light-transmitting layer overlaps adjacent second light-emitting elements among the plurality of second light-emitting elements and the light-reflective member disposed between the adjacent second light-emitting elements in a top view.

According to an embodiment of the present disclosure, a light-emitting device includes a first light-emitting element; at least two second light-emitting elements located at a periphery of the first light-emitting element, the at least two second light-emitting elements being adjacent to each other, the at least two second light-emitting elements that emit light collectively; a light-reflective member located between two second light-emitting elements among the at least two second light-emitting elements; a first light-transmitting layer located above the first light-emitting element; and a second light-transmitting layer located above the light-reflective member to overlap the two second light-emitting elements.

According to an embodiment of the present disclosure, a light-emitting device and a light-emitting module can reduce uneven irradiation due to dark portions between adjacent light-emitting elements.

DETAILED DESCRIPTION

Figure 1:
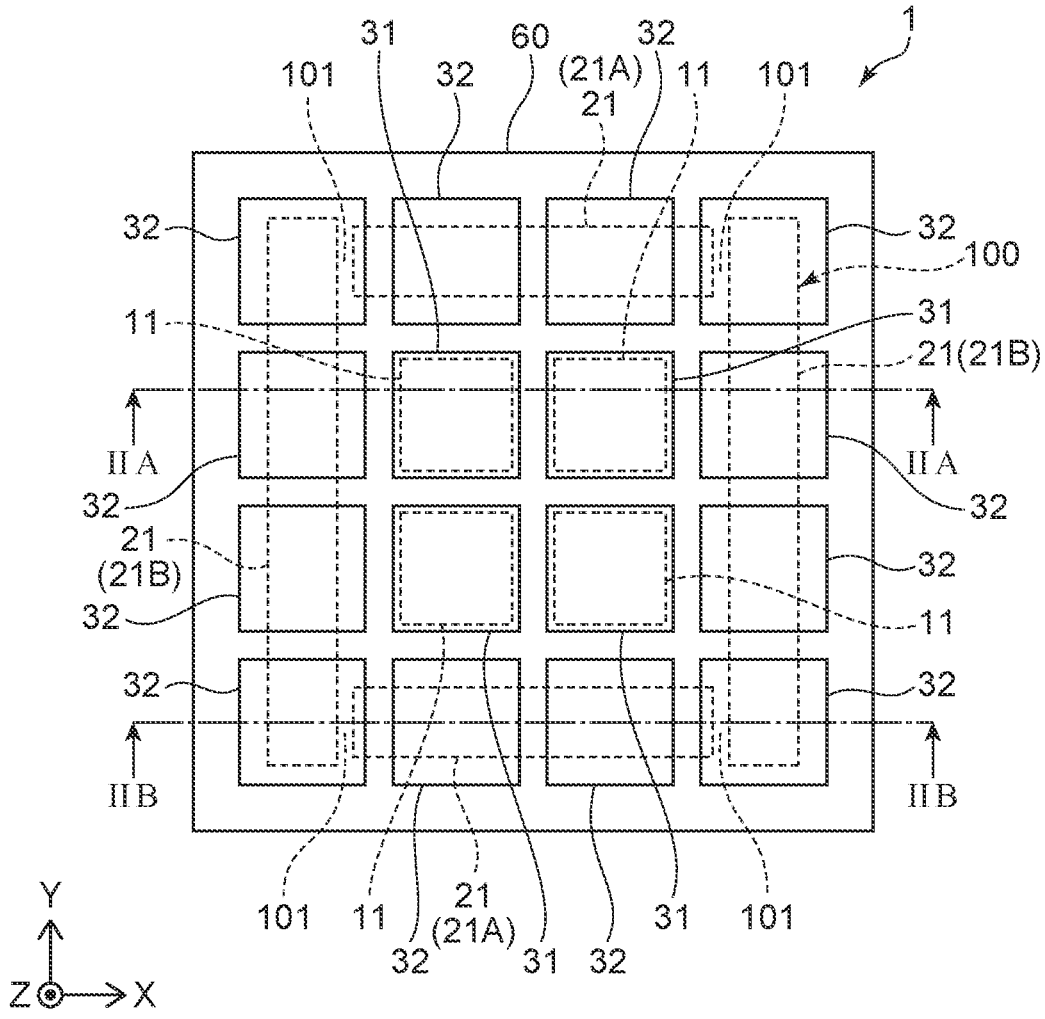
FIG. 1 is a schematic top view of a light-emitting device according to a first embodiment.

A light-emitting device and a light-emitting module according to embodiments of the disclosure will now be described with reference to the drawings. The following embodiments illustrate light-emitting devices and light-emitting modules that embody technical concepts of the invention, but the invention is not limited to the described embodiments. Unless specifically stated, the dimensions, materials, shapes, relative arrangements, etc., of the components described in the embodiments are merely illustrative examples, and are not intended to limit the scope of the invention. The sizes, positional relationships, etc., of the members shown by the drawings may be exaggerated for clarity of description. In the following description, the same names and reference numerals refer to the same or similar members, and a detailed description is omitted as appropriate. End views that show only cross sections may be used as cross-sectional views.

In the following description, terms that indicate specific directions or positions (e.g., "up," "down," and other terms including such terms) may be used. Such terms, however, are used merely for better understanding of relative directions or positions when referring to the drawings. As long as the relationships are the same, the relative directions or positions according to terms such as "up," "down," etc., used when referring to the drawings may not have the same arrangements as drawings, actual products, and the like outside the disclosure. In the specification, when assuming two members, for example, the positional relationship expressed as "up (or down)" also includes the case where the two members are in contact, and the case where the two members are not in contact, and one of the members is positioned above (or below) the other member.

In the drawings, directions may be shown using an X-axis, a Y-axis, and a Z-axis. An X-direction along the X-axis indicates a prescribed direction in the light-emitting surface of the light-emitting device according to the embodiment. A Y-direction along the Y-axis indicates a direction orthogonal to the X-direction in the light-emitting surface. A Z-direction along the Z-axis indicates a direction orthogonal to the light-emitting surface. In other words, the light-emitting surface of the light-emitting device is parallel to the XY plane, and the Z-axis is orthogonal to the XY plane. According to the embodiments, the members may be described using a first direction, a second direction crossing the first direction, and a third direction crossing the first and second directions. According to the embodiments, the first direction may be described as a direction along the X-axis, the second direction may be described as a direction along the Y-axis, and the third direction may be described as a direction along the Z-axis. The first direction, the second direction, and the third direction are not necessarily along the X-axis, the Y-axis, and the Z-axis.

First Embodiment

A light-emitting device 1 in a first embodiment according to the disclosure includes a light source 100 including a first light source part 10 and a second light source part 20, at least one first light-transmitting layer 31 located above the first light source part 10, at least one second light-transmitting layer 32 located above the second light source part 20, and a light-reflective member 60, wherein the second light source part 20 is located outward of the first light source part 10 to surround the first light source part 10 in a top view.

Component members of the light-emitting device 1 according to the first embodiment will now be described with reference to FIGS. 1 to 3. One direction, e.g., an X-direction, in the light-emitting surface of the light-emitting device 1 in a top view is taken as a first direction X. A direction, e.g., a Y-direction, that crosses the first direction X in the light-emitting surface of the light-emitting device 1 is taken as a second direction Y. The direction from a first light-emitting element 11 toward the first light-transmitting layer 31 or the direction from a second light-emitting element 21 toward the second light-transmitting layer 32 is taken as a third direction Z.

Light Source

The light source 100 includes the first light source part 10 and the second light source part 20. The first light source part 10 includes at least one first light-emitting element 11. According to the first embodiment, the first light source part 10 includes a plurality of first light-emitting elements 11. In the example shown in FIGS. 1 and 3, four first light-emitting elements 11 are arranged in the first direction X and in the second direction Y crossing the first direction X. The shapes, arrangement, and number of the first light-emitting elements 11 are not limited thereto. It is sufficient to include at least one first light-emitting element 11, and the shapes, arrangement, and number of the first light-emitting elements 11 are modifiable as appropriate according to the application of the light-emitting device 1, etc.

The second light source part 20 is located outward of the first light source part 10 to surround the first light source part 10 in a top view. The second light source part 20 includes a plurality of second light-emitting elements 21 that collectively emit light. The plurality of second light-emitting elements 21 include at least two adjacent second light-emitting elements 21 located at the periphery of the first light-emitting element 11 in a top view.

The plurality of second light-emitting elements 21 collectively emit light. The state in which all of the plurality of second light-emitting elements 21 emit light and the state in which none of the plurality of second light-emitting elements 21 emit light are collectively switched. For example, the plurality of second light-emitting elements 21 being collectively lit or unlit can be controlled by a light emission controller 201 described below. By the plurality of second light-emitting elements 21 being collectively lit or unlit, the number of the light emission controller 201 channels allocated to the second light source part 20 is one, and it is easier to route the wiring of the light source 100 and the light emission controller 201. The plurality of second light-emitting elements 21 may be connected in series, connected in parallel, or connected by combining series connections and parallel connections. The at least one first light-emitting element 11 may be connected in series, connected in parallel, or connected by combining series connections and parallel connections. For example, by connecting the at least one first light-emitting element 11 in parallel, each first light-emitting element 11 can be individually controlled by the light emission controller 201. Thereby, each first light-emitting element 11 can be individually lit to the desired brightness, and the contrast of the irradiated light of the first light source part 10 can be improved.

For example, the light-emitting device 1 according to the embodiment can be used as a flash light source of the imaging device. For example, the imaging device is mounted in a portable communication terminal. When the light-emitting device 1 according to the embodiment is used as the flash light source of an imaging device, for example, light can be irradiated by switching between a wide-angle mode in which both the first and second light source parts 10 and 20 emit light and a narrow-angle mode in which the first light source part 10 emits light but the second light source part 20 does not emit light. The illumination angle of the light is narrower in the narrow-angle mode than in the wide-angle mode. Because the light-emitting device 1 can switch the irradiated light according to the wide-angle mode and the narrow-angle mode, for example, the imaging device can image according to close-up and telephoto imaging modes, etc.

When the light-emitting device 1 according to the embodiment is used as the flash light source of an imaging device, for example, the irradiation of each first light-emitting element 11 of the first light source part 10 is individually controlled, and the irradiation of the second light-emitting elements 21 of the second light source part 20 is collectively controlled. In the wide-angle mode, both the first and second light source parts 10 and 20 irradiate, and in the narrow-angle mode, only the first light source part 10 irradiates. According to this configuration, in the wide-angle mode, high-contrast illumination of the central portion of the angle of view is possible by the irradiation by the individually-controlled first light-emitting elements 11 of the first light source part 10, and the brightness of the edge portion of the angle of view corresponding to the background or the like can be compensated by the irradiation by the second light source part 20. Also, in the narrow-angle mode, high-contrast illumination of the entire angle of view is possible by the irradiation by the individually-controlled first light-emitting elements 11 of the first light source part 10. Other than the first and second light source parts 10 and 20, the light-emitting device 1 may include a third light source part located outward of the second light source part 20, etc. For example, the light-emitting device that includes the first light source part 10, the second light source part 20, and the third light source part can irradiate according to an ultra-wide-angle mode by irradiation by all of the light source parts.

Figure 3:
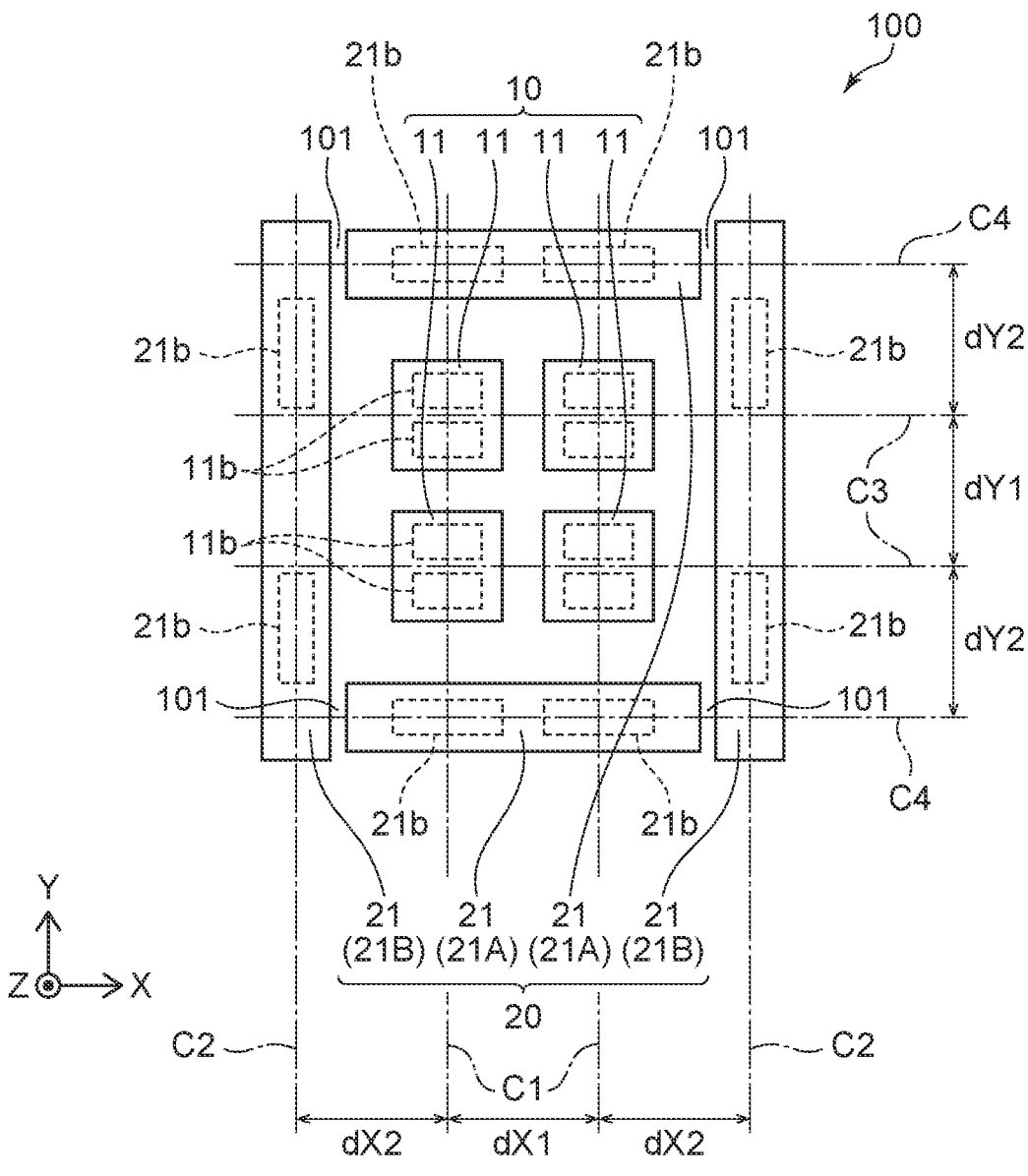
FIG. 3 is a schematic top view showing only a first light source part and a second light source part according to the first embodiment.

In the example shown in FIGS. 1 and 3, the second light source part 20 includes four second light-emitting elements 21. The four second light-emitting elements 21 include two second light-emitting elements 21A having rectangular shapes extending in the first direction X, and two second light-emitting elements 21B having rectangular shapes extending in the second direction Y. The two second light-emitting elements 21A are separated from each other in the second direction Y. The two second light-emitting elements 21B are separated from each other in the first direction X. The length in the first direction X of the second light-emitting element 21A is greater than the length in the second direction Y of the second light-emitting element 21A. The length in the second direction Y of the second light-emitting element 21B is greater than the length in the first direction X of the second light-emitting element 21B. In a top view, the first light source part 10 is positioned between the two second light-emitting elements 21B separated from each other in the first direction X and between the two second light-emitting elements 21A separated from each other in the second direction Y. In a top view, the second light-emitting element 21A and the second light-emitting element 21B are adjacent in the first direction X and separated by a gap 101. In the light source 100 according to the first embodiment, the gap 101 is positioned between the side surface of the second light-emitting element 21A extending in the second direction Y and the side surface of the second light-emitting element 21B extending in the second direction Y.

It is preferable for the gap 101 between the adjacent second light-emitting elements 21 in a top view to be narrow. The gap 101 between the adjacent second light-emitting elements can be the separation distance between the surfaces of the two second light-emitting elements 21 that face each other in a top view. The gap 101 between the adjacent second light-emitting elements 21 is, for example, 0.01 times or more and 0.16 times or less the length in the longitudinal direction of the second light-emitting element 21, and more preferably not less than 0.02 times and not more than 0.08 times. The gap 101 between the adjacent second light-emitting elements 21 is, for example, 10 μm or more and 200 μm or less, and more preferably 20 μm or more and 100 μm or less. By setting the gap 101 between the adjacent second light-emitting elements 21 as described above, a dark region between the second light-emitting elements 21 can be reduced.

As shown in FIG. 3, it is preferable for a distance dX1 between center lines C1 that extend in the second direction Y through the centers of the first light-emitting elements 11 in the first direction X to be substantially equal to a distance dX2 between the center line C1 and a center line C2 extending in the second direction Y through the center of the second light-emitting element 21B adjacent to the first light-emitting element 11. Similarly, it is preferable for a distance dY1 between center lines C3 extending in the first direction X through centers of the first light-emitting elements 11 in the second direction Y to be substantially equal to a distance dY2 between the center line C3 and a center line C4 extending in the first direction X through the center of the second light-emitting element 21A adjacent to the first light-emitting element 11. Here, "substantially equal" includes an error of ±5% or less.

It is sufficient for the second light source part 20 to be located outward of the first light source part 10 and to surround the first light source part 10 in a top view, and the configuration of the second light-emitting element 21 included in the second light source part 20 is not limited to the configuration described above. The shapes, arrangement, and number of the second light-emitting elements 21 are not limited thereto. It is sufficient to include at least two second light-emitting elements 21, and the shapes, arrangement, and number of the second light-emitting elements 21 are modifiable as appropriate according to the application of the light-emitting device 1, etc.

Figure 2A:
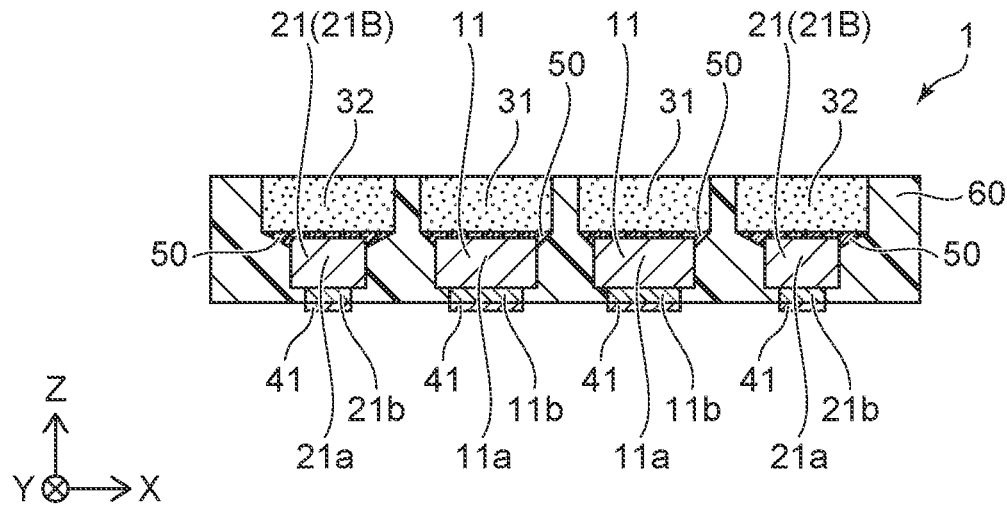
FIG. 2A is a schematic cross-sectional view along line IIA-IIA of FIG. 1.

As shown in FIG. 2A, the first light-emitting element 11 includes a semiconductor structure body 11a, and an electrode 11b located below the semiconductor structure body 11a. As shown in FIG. 3, the first light-emitting element 11 includes two electrodes 11b separated in the second direction Y. One of the two electrodes 11b functions as an anode electrode, and the other functions as a cathode electrode. The two electrodes 11b may be separated in the first direction X. The two electrodes 11b may be separated in a direction oblique to the first and second directions X and Y. The semiconductor structure body 11a may include a support substrate, and a semiconductor layer located on the support substrate. In such a case, the support substrate, the semiconductor layer, and the electrode 11b are arranged in this order. The number of the electrodes 11b of the first light-emitting element 11 may be three or more.

The second light-emitting element 21 includes a semiconductor structure body 21a, and an electrode 21b located below the semiconductor structure body 21a. As shown in FIG. 3, the second light-emitting element 21A includes two electrodes 21b separated in the first direction X. The second light-emitting element 21B includes two electrodes 21b separated in the second direction Y. Among the two electrodes 21b included in the second light-emitting element 21, one functions as an anode electrode, and the other functions as a cathode electrode. The two electrodes 21b may be separated in a direction oblique to the first and second directions X and Y. The semiconductor structure body 21a may include a support substrate, and a semiconductor layer located on the support substrate. In such a case, the support substrate, the semiconductor layer, and the electrode 21b are arranged in this order. The number of the electrodes 21b of the second light-emitting element 21 may be three or more.

The semiconductor structure body 11a and the semiconductor structure body 21a include nitride semiconductors. In the specification, nitride semiconductor includes, for example, all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively. Nitride semiconductor further includes Group V elements other than N (nitrogen) in the chemical formula above, various elements added to control various properties such as the conductivity type of the semiconductor, etc. The semiconductor structure body 11a and the semiconductor structure body 21a include active layers. The active layer is a light-emitting layer that emits light and has, for example, a MQW (Multiple Quantum well) structure that includes a plurality of barrier layers and a plurality of well layers. The light that is emitted by the active layer is, for example, ultraviolet light or visible light. The light emission peak wavelength of the active layer of the first light-emitting element 11 and the light emission peak wavelength of the active layer of the second light-emitting element 21 may be the same or different. The semiconductor structure body 11a and the semiconductor structure body 21a each may include two or more active layers. The light emission peak wavelengths of the two or more active layers may be the same or different.

Light-Transmitting Layer

At least one first light-transmitting layer 31 is located above the first light source part 10. For example, the number of the first light-transmitting layers 31 is equal to the number of the first light-emitting elements 11. In the light-emitting device 1 of the embodiment, one first light-transmitting layer 31 is located above one first light-emitting element 11. By providing one first light-transmitting layer 31 above one first light-emitting element 11 and by providing the light-reflective member 60 between the first light-transmitting layers 31, the overlap in the light-emitting surface of the light-emitting device 1 of the light-emitting region of one first light-emitting element 11 irradiating via the first light-transmitting layer 31 and the light-emitting region of the adjacent first light-emitting element 11 irradiating via the first light-transmitting layer 31 can be reduced. Thereby, the luminance difference between the light-emitting region and the non-light-emitting region can be increased, and the boundary between the irradiation surface of the first light-transmitting layer 31 and the light-reflective member 60 surrounding the periphery of the first light-transmitting layer 31 can be distinct. In other words, the light-emitting device can have high contrast and a neatly-trimmed appearance. The number and arrangement of the first light-transmitting layers 31 is not limited thereto. For example, in a top view, one first light-transmitting layer 31 also may overlap the entire upper surface of two or more first light-emitting elements 11.

At least one second light-transmitting layer 32 is located above the second light source part 20. In the light-emitting device 1 according to the embodiment, a plurality of second light-transmitting layers 32 are located above the second light source part 20. At least two second light-transmitting layers 32 are located on the second light-emitting element 21. In the light-emitting device 1 according to the embodiment, the planar shapes and planar sizes of the first and second light-transmitting layers 31 and 32 are substantially equal respectively, and the first light-transmitting layer 31 and the second light-transmitting layer 32 are arranged at uniform spacing in the first and second directions X and Y. Thereby, the central axes of the light irradiated from the light-transmitting layers in the irradiation region of the entire light-emitting device 1 are easily arranged at uniform spacing. It is therefore easier to control the contrast of the irradiated light in the irradiation region of the entire light-emitting device 1. For example, as shown in FIG. 1, at least three second light-transmitting layers 32 are provided in the first direction X or the second direction Y, and at least three second light-transmitting layers 32 are arranged at uniform spacing in a top view.

The first light-transmitting layer 31 and the second light-transmitting layer 32 may include a fluorescent material or a light-diffusing material described below. By including a fluorescent material or a light-diffusing material, the first light-transmitting layer 31 and the second light-transmitting layer 32 can emit light in a state in which the light passing through the first and second light-transmitting layers 31 and 32 is sufficiently diffused.

Bonding Member

Figure 2B:
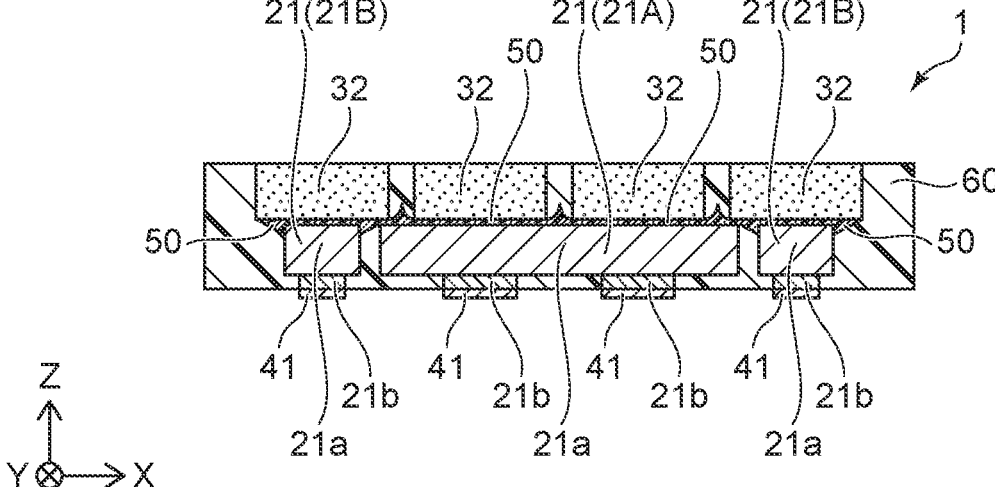
FIG. 2B is a schematic cross-sectional view along line IIB-IIB of FIG. 1.

As shown in FIG. 2A, the first light-emitting element 11 and the first light-transmitting layer 31 are bonded by a bonding member 50 located between the first light-emitting element 11 and the first light-transmitting layer 31. As shown in FIGS. 2A and 2B, the second light-emitting element 21 and the second light-transmitting layer 32 are bonded by the bonding member 50 located between the second light-emitting element 21 and the second light-transmitting layer 32. The bonding member 50 covers the upper surface of the first light-emitting element 11, the upper surface of the second light-emitting element 21, a portion of the side surface of the first light-emitting element 11, and a portion of the side surface of the second light-emitting element 21. The bonding member 50 is transparent to the light emitted by the first light-emitting element 11 and the light emitted by the second light-emitting element 21. Herein, "transparent" preferably means transmitting 60% or more of the light from the light-emitting element. It is preferable to use a transparent resin as the material of the bonding member 50; for example, a silicone resin can be used preferably.

Light-Reflective Member

The light-reflective member 60 is reflective to the light emitted by the first light source part 10 and the light emitted by the second light source part 20. The light-reflective member 60 is located between the plurality of second light-emitting elements 21. In the light-emitting device 1 according to the first embodiment, the light-reflective member 60 is located between the first light-emitting element 11 and the adjacent first light-emitting element 11, between the first light-emitting element 11 and the adjacent second light-emitting element 21, and between the second light-emitting element 21 and the adjacent second light-emitting element 21. By providing the light-reflective member 60 between the light-emitting elements, the incidence at the light-emitting surface of the light irradiated via the light-transmitting layer by one light-emitting element on the light-emitting region of the light irradiated via the light-transmitting layer by an adjacent light-emitting element can be reduced. Thereby, the luminance difference between the light-emitting region and the non-light-emitting region can be increased, and the boundary between the irradiation surface of the first light-transmitting layer 31 and the light-reflective member 60 surrounding the periphery of the first light-transmitting layer 31 can be distinct. In other words, the light-emitting device can have high contrast and a neatly-trimmed appearance. To increase the light extraction efficiency, it is preferable for the light-reflective member 60 to include a member having high light reflectance.

In the light-emitting device 1 according to the embodiment, the light-reflective member 60 covers the side surface of the first light-transmitting layer 31, the side surface of the second light-transmitting layer 32, and the side surface of the bonding member 50. The upper surface of the first light-transmitting layer 31 and the upper surface of the second light-transmitting layer 32 are not covered with the light-reflective member 60 at the light-emitting surface. The light-emitting surface is the main light extraction surface. Also, the light-reflective member 60 covers the side surfaces and lower surfaces of the semiconductor structure bodies 11a and 21a of the first and second light-emitting elements 11 and 21. The light-reflective member 60 covers the side surface of the electrode 11b of the first light-emitting element 11 and the side surface of the electrode 21b of the second light-emitting element 21. The lower surface of the electrode 11b and the lower surface of the electrode 21b are not covered with the light-reflective member 60.

The width of the light-reflective member 60 positioned between the first light-transmitting layers 31, between the second light-transmitting layers 32, and between the first light-transmitting layer 31 and the second light-transmitting layer 32 at the light-emitting surface is, for example, 0.004 times or more and 0.08 times or less the length in the longitudinal direction of the second light-emitting element 21, preferably 0.008 times or more and 0.055 times or less, and more preferably 0.012 times or more and 0.04 times or less. The width of the light-reflective member 60 positioned between the light-transmitting layers is, for example, 5 μm or more and 100 μm or less, preferably 10 μm or more and 70 μm or less, and more preferably 15 μm or more and 50 μm or less. Thereby, the light-emitting module can have a neatly-trimmed appearance between the light-emitting region and the non-light-emitting region while downsizing the light-emitting device 1 in a top view.

In a top view, one second light-transmitting layer 32 among the one or more second light-transmitting layers 32 overlaps over adjacent second light-emitting elements 21 among the plurality of second light-emitting elements 21 and over the light-reflective member 60 located in the gap 101 between the adjacent second light-emitting elements 21. In the light-emitting device 1 according to the embodiment, four gaps 101 are located between the two second light-emitting elements 21A and the two second light-emitting elements 21B. One second light-transmitting layer 32 is positioned above each of the light-reflective members 60 positioned in the four gaps 101.

As described above, all of the plurality of second light-emitting elements 21 emit light when the second light source part 20 emits light. Generally, when a plurality of light-emitting elements provided in an arrangement emit light, the region between adjacent light-emitting elements has a lower luminance than the light emitted directly upward from the light-emitting element, and is highly noticeable as a dark portion. On the other hand, according to the light-emitting device 1 according to the embodiment, one second light-transmitting layer 32 overlaps over the adjacent second light-emitting elements 21 and the light-reflective member 60 located in the gap 101 between the adjacent second light-emitting elements 21. According to this configuration, the light that is emitted from each of the adjacent second light-emitting elements 21 propagates through the interior of the second light-transmitting layer 32 positioned above the gap 101 and is irradiated upward. The decrease of the luminance between the adjacent second light-emitting elements 21 can be reduced thereby, and the uneven irradiation of the light-emitting device 1 (the unevenness of the brightness of the irradiated image of the light from the light-emitting device 1) can be reduced.

Specific configurations and materials of the first light-transmitting layer 31, the second light-transmitting layer 32, and the light-reflective member 60 are illustrated below. The first light-transmitting layer 31 and the second light-transmitting layer 32 may include a fluorescent material or a light-diffusing material. When the first light-transmitting layer 31 and the second light-transmitting layer 32 include a fluorescent material, the first light-transmitting layer 31 and the second light-transmitting layer 32 perform wavelength conversion of at least a portion of the light from the light-emitting elements. When including a fluorescent material, examples of the first light-transmitting layer 31 and the second light-transmitting layer 32 may be a fluorescent material included in a resin material, a ceramic, glass, or the like, a sintered body of a fluorescent material, etc. When including a fluorescent material, the first light-transmitting layer 31 and the second light-transmitting layer 32 may be resin layers that include fluorescent materials and are located on one surface of a formed body such as a resin, a ceramic, glass, etc. As the fluorescent material, for example, an yttrium-aluminum-garnet-based fluorescent material (e.g., $Y_3(Al, Ga)_5O_{12}:Ce$), a lutetium-aluminum-garnet-based fluorescent material (e.g., $Lu_3(Al, Ga)_5O_{12}:Ce$), a terbium-aluminum-garnet-based fluorescent material (e.g., $Tb_3(Al,$ $Ga)_5O_{12}:Ce$), a CCA-based fluorescent material (e.g., $Ca_{10}(PO_4)_6Cl_2:Eu$), an SAE-based fluorescent material (e.g., $Sr_4Al_{14}O_{25}:Eu$), a chlorosilicate-based fluorescent material (e.g., $Ca_8MgSi_4O_{16}Cl_2:Eu$), a nitride-based fluorescent material, a fluoride-based fluorescent material, a fluorescent material having a perovskite structure (e.g., CsPb(F, Cl, Br, I)₃), a quantum dot fluorescent material (e.g., CdSe, InP, $AgInS_2$, $AgInSe_2$, $AgInGaS_2$, or $CuAgInS_2$), etc., can be used. Examples of nitride-based fluorescent materials are a β-sialon-based fluorescent material (e.g., $(Si, Al)_3(O, N)_4:Eu$), an α-sialon-based fluorescent material (e.g., $Ca(Si, Al)_{12}(O, N)_{16}:Eu$), an SLA-based fluorescent material (e.g., $SrLiAl_3N_4:Eu$), a CASN-based fluorescent material (e.g., $CaAlSiN_3:Eu$), a SCASN-based fluorescent material (e.g., $(Sr, Ca)AlSiN_3:Eu$), etc., and examples of fluoride-based fluorescent materials are a KSF-based fluorescent material (e.g., $K_2SiF_6:Mn$), a KSAF-based fluorescent material (e.g., $K_2(Si, Al)F_6:Mn$), a MGF-based fluorescent material (e.g., $3.5MgO\cdot0.5MgF_2\cdot GeO_2:Mn$), etc. The fluorescent materials described above are particles.

The first light-transmitting layer 31 and the second light-transmitting layer 32 each may include one type of fluorescent material or may include a plurality of types of fluorescent materials. For example, the first light source part 10 emits mixed light of the color of visible light emitted by the first light-emitting element 11 and the color of the light emitted by the fluorescent material of the first light-transmitting layer 31 excited by the light emitted by the first light-emitting element 11. Or, the first light source part 10 emits mixed light of the color of ultraviolet light emitted by the first light-emitting element 11 and the color of the light emitted by the fluorescent material of the first light-transmitting layer 31 excited by the light emitted by the first light-emitting element 11. For example, the second light source part 20 emits mixed light of the color of visible light emitted by the second light-emitting element 21 and the color of the light emitted by the fluorescent material of the second light-transmitting layer 32 excited by the light emitted by the second light-emitting element 21. Or, the second light source part 20 emits mixed light of the color of ultraviolet light emitted by the second light-emitting element 21 and the color of the light emitted by the fluorescent material of the second light-transmitting layer 32 excited by the light emitted by the second light-emitting element 21. The peak wavelength of the light emitted by the first light source part 10 and the peak wavelength of the light emitted by the second light source part 20 may be the same or different. Each of the first light-transmitting layer 31 or the second light-transmitting layer 32 may be a single layer or a plurality of layers. When the first light-transmitting layer 31 or the second light-transmitting layer 32 includes a plurality of layers, each layer may include a different fluorescent material.

Examples of the light-diffusing materials included in the first and second light-transmitting layers 31 and 32 include titanium oxide, silicon oxide, etc. As the resins of the first and second light-transmitting layers 31 and 32, for example, thermosetting resins such as a silicone resin, a silicone-modified resin, an epoxy resin, an epoxy-modified resin, a phenol resin, etc., can be used. In particular, a silicone resin or silicone-modified resin that has superior lightfastness and heat resistance is preferable.

The light-reflective member 60 can include, for example, a resin material including a light-reflective substance such as a white pigment, etc. Examples of light-reflective substances include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, silicon oxide, etc.; among these substances, it is preferable to use one of these substances alone, or a combination of two or more of these substances. It is preferable for the base material of the resin material to be a resin material having a thermosetting resin such as an epoxy resin, a silicone resin, a silicone-modified resin, a phenol resin, etc., as a major component.

Second Embodiment

Figure 4A:
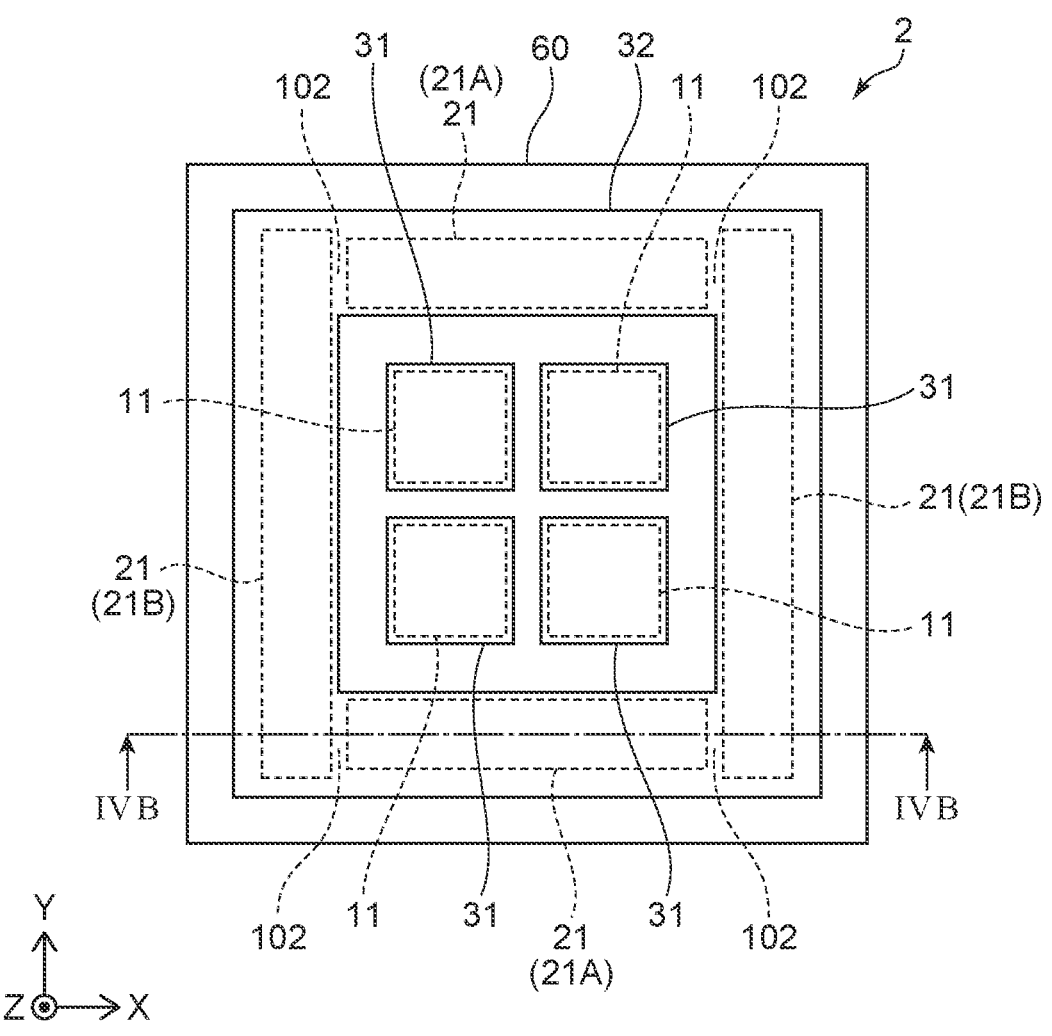
FIG. 4A is a schematic top view of a light-emitting device according to a second embodiment.
Figure 4B:
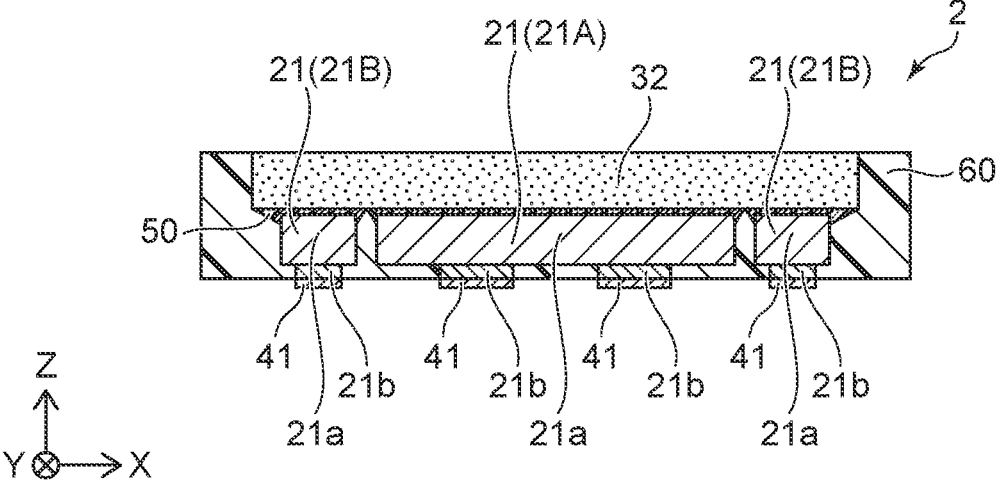
FIG. 4B is a schematic cross-sectional view along line IVB-IVB of FIG. 4A.

A light-emitting device 2 of a second embodiment according to the disclosure will now be described with reference to FIGS. 4A and 4B. The light-emitting device 2 according to the second embodiment differs from the light-emitting device 1 according to the first embodiment mainly in that one second light-transmitting layer 32 is included. The one second light-transmitting layer 32 overlaps the entire surface of the plurality of second light-emitting elements 21 in a top view. Also, the second light-transmitting layer 32 is positioned above the light-reflective member 60 located in a gap 102 between the adjacent second light-emitting elements 21.

In the light-emitting device 2, one continuous second light-transmitting layer 32 is not covered with the light-reflective member 60 at the light-emitting surface. All of the second light-emitting elements 21 are positioned below the one continuous second light-transmitting layer 32, and the light that is emitted by all of the second light-emitting elements 21 is extracted to the outside via the one second light-transmitting layer 32. The one continuous second light-transmitting layer 32 overlaps over the entire surface of the plurality of second light-emitting elements 21 and the light-reflective member 60 located in the gaps 102 between the adjacent second light-emitting elements 21. In the light-emitting device 2 according to the second embodiment, the second light-transmitting layer 32 is a continuous ring-shaped light-transmitting layer. Because a gap is not provided in the second light-transmitting layer 32 positioned on the second light source part 20 in the light-emitting device 2, the uneven irradiation that is caused by the gaps between the second light-transmitting layers 32 can be further suppressed compared to the light-emitting device 1 of the first embodiment. For example, the one continuous second light-transmitting layer 32 can be prepared by preparing a flat-plate light-transmitting layer, and then by using a dicing blade to cut away an inner portion by using a chopper cut technique or a chopper-traverse technique. Specifically, when forming the ring-shaped second light-transmitting layer 32 of the light-emitting device 2, four cuts are made in the inner portion of the light-transmitting layer by lowering the dicing blade vertically from directly above the flat-plate light-transmitting layer, so that the end portions of the four cuts are linked to each other. Thereby, the ring-shaped second light-transmitting layer 32 can be prepared by removing the inner portion of the flat-plate light-transmitting layer. The cutting method is not limited to a dicing blade and may be, for example, a laser. A transparent resin material can be prepared by printing in a ring shape and by curing. Also, the ring-shaped second light-transmitting layer 32 can be prepared by procuring, etc.

According to the embodiment, the planar size of the second light-emitting element 21 is greater than the planar size of the first light-emitting element 11. Generally, the light-emitting elements at the outer side that surround the light source part at the inside tend to be more numerous. As the number of light-emitting elements increases, the number of dark gaps increases, and the luminance of the light-emitting elements located at the outer side decreases as an entirety. On the other hand, according to the light-emitting device of the embodiment, the decrease of the luminance of the second light source part 20 can be suppressed by using light-emitting elements having large planar sizes as the second light-emitting element 21 at the outer side while reducing the number of the second light-emitting elements 21.

The placement of the second light-emitting elements 21 is made easier by increasing the planar size of the second light-emitting element 21. According to the embodiment, the second light-emitting element 21 is formed in a rectangular shape along one side of the quadrilateral light-emitting device 2 in a top view. The planar size relationship of the first and second light-emitting elements 11 and 21 also is applicable to the light-emitting device 1 according to the first embodiment.

Third Embodiment

Figure 5A:
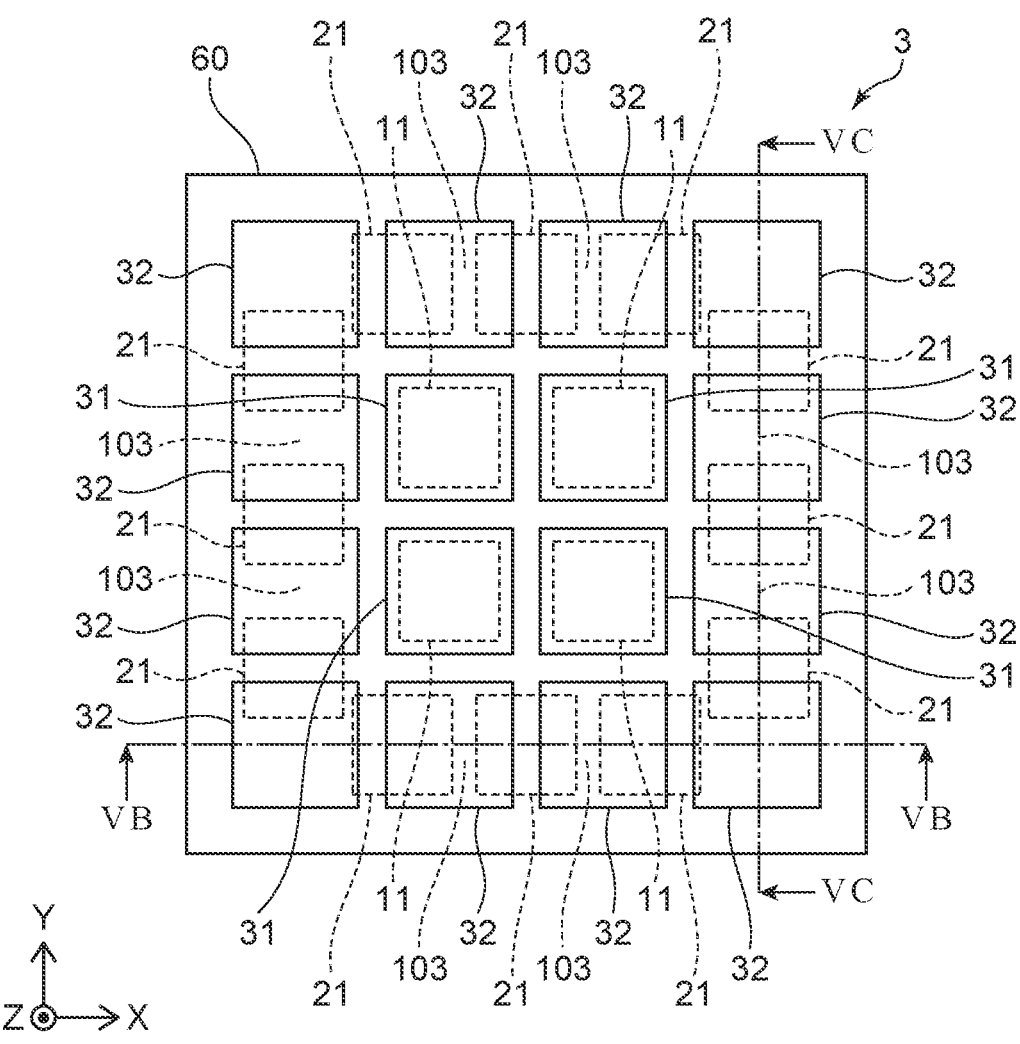
FIG. 5A is a schematic top view of a light-emitting device according to a third embodiment.
Figure 5B:
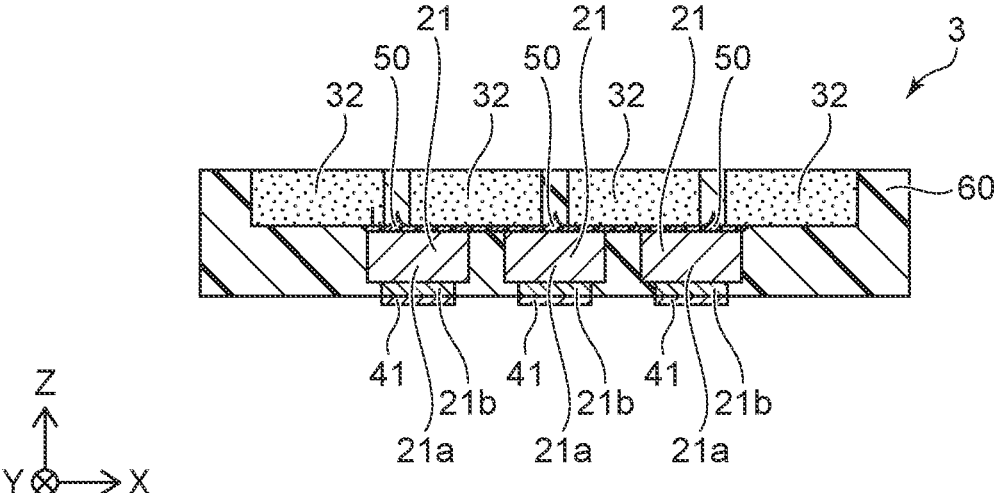
FIG. 5B is a schematic cross-sectional view along line VB-VB of FIG. 5A.
Figure 5C:
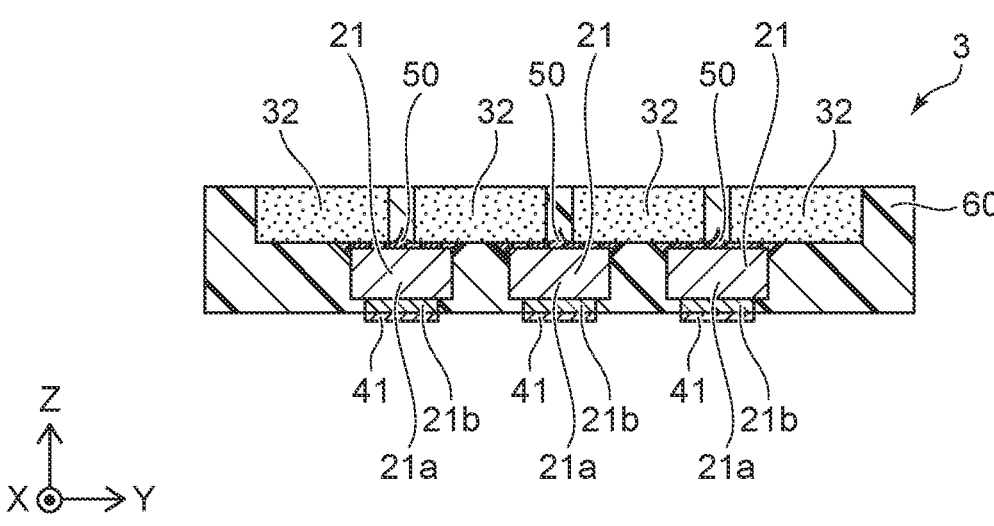
FIG. 5C is a schematic cross-sectional view along line VC-VC of FIG. 5A.

A light-emitting device 3 of a third embodiment according to the disclosure will now be described with reference to FIGS. 5A to 5C. The light-emitting device 3 according to the third embodiment differs from the light-emitting device 1 according to the first embodiment mainly in that the shape and planar size are respectively the same between the first light-emitting element 11 and the second light-emitting element 21.

In the light-emitting device 3 according to the third embodiment, the shape and planar size of the second light-emitting element 21 are respectively the same as the shape and planar size of the first light-emitting element 11. The plurality of second light-emitting elements 21 are located outward of the first light source part 10 to surround the first light source part 10 in a top view.

The plurality of second light-transmitting layers 32 are located above the second light source part 20 that includes the plurality of second light-emitting elements 21. One second light-transmitting layer 32 among the plurality of second light-transmitting layers 32 overlaps over the adjacent second light-emitting elements 21 and the light-reflective member 60 located in a gap 103 between the adjacent second light-emitting elements 21 in a top view. The plurality of second light-transmitting layers 32 are arranged at uniform spacing in the first and second directions X and Y.

The first light-emitting element 11 and the second light-emitting element 21 include same shape and planar size. For example, light-emitting elements that are singulated from the same wafer can be used as the first and second light-emitting elements 11 and 21. Thereby, a lower cost is possible compared to when two types of light-emitting elements having different shapes and planar sizes are prepared.

Fourth Embodiment

Figure 6:
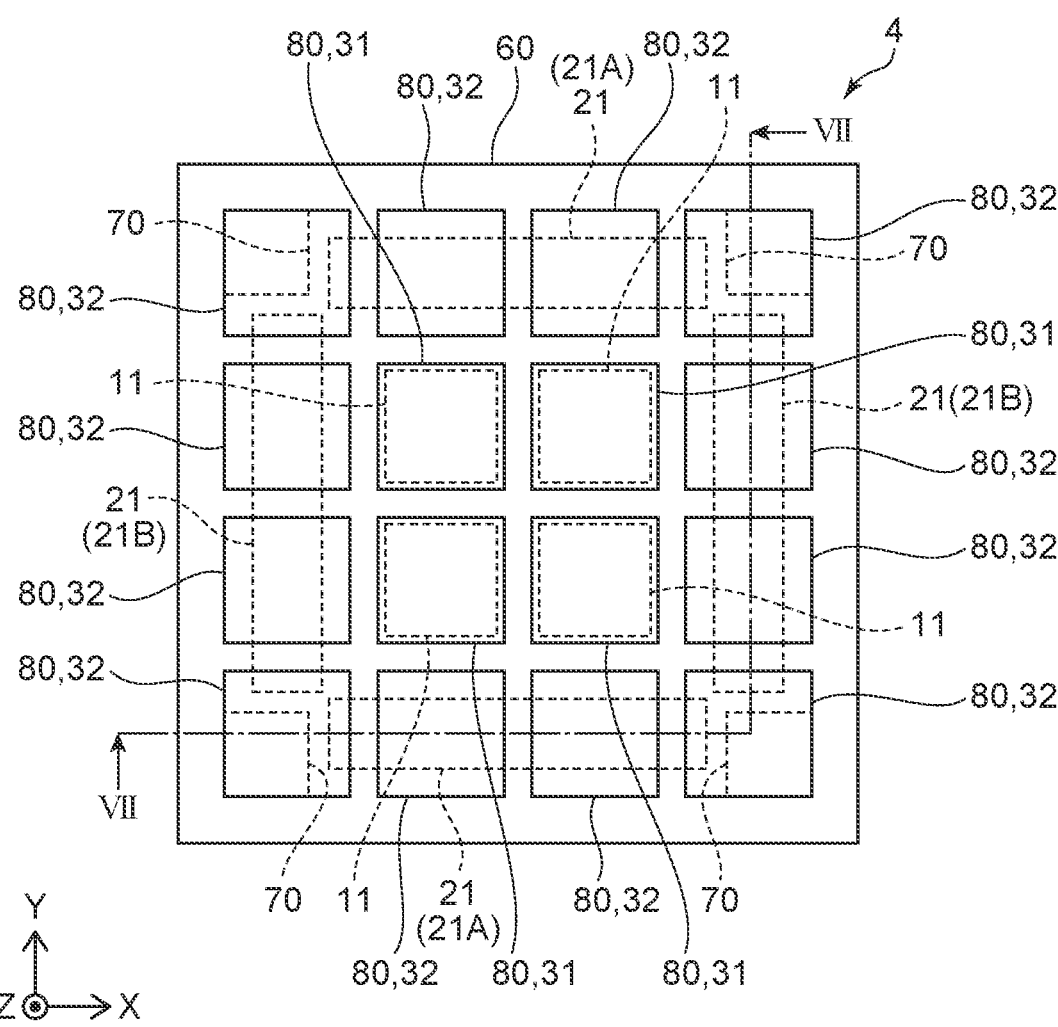
FIG. 6 is a schematic top view of a light-emitting device according to a fourth embodiment.

A light-emitting device 4 of a fourth embodiment according to the disclosure will now be described with reference to FIGS. 6 and 7. The light-emitting device 4 according to the fourth embodiment differs from the light-emitting device 1 according to the first embodiment mainly in that the light-emitting device 4 further includes a light-transmitting member 70.

The plurality of second light-emitting elements 21 include two second light-emitting elements 21A having rectangular shapes extending in the first direction X, and two second light-emitting elements 21B having rectangular shapes extending in the second direction Y. In the light-emitting device 4, the length in the longitudinal direction of the second light-emitting element 21A and the length in the longitudinal direction of the second light-emitting element 21B are the same. Also, the length in the transverse direction of the second light-emitting element 21A and the length in the transverse direction of the second light-emitting element 21B are the same. Accordingly, for example, light-emitting elements that have the same shape and planar size and are singulated from the same wafer can be used as the plurality of second light-emitting elements 21. Thereby, a lower cost is possible compared to when two types of second light-emitting elements 21 having different lengths are prepared.

One second light-transmitting layer 32 among the plurality of second light-transmitting layers 32 overlaps over the adjacent second light-emitting elements 21 and the light-reflective member 60 located between the adjacent second light-emitting elements 21 in a top view. By providing the second light-transmitting layer 32 that overlaps over the adjacent second light-emitting elements 21, the light that is emitted from each second light-emitting element 21 propagates through the second light-transmitting layer 32 positioned above the second light-emitting element 21 and is irradiated upward. The decrease of the luminance between the adjacent second light-emitting elements 21 can be reduced thereby, and the uneven irradiation of the light-emitting device 4 can be reduced.

The light-emitting device 4 further includes the light-transmitting member 70. The light-transmitting member 70 is transparent to the light emitted by the light-emitting elements. The light-transmitting member 70 includes, for example, a resin. The same material as the resin material included in the first light-transmitting layer 31 or the second light-transmitting layer 32 described above can be used as the resin included in the light-transmitting member 70. Also, the light-transmitting member 70 may include a fluorescent material or a light-diffusing material. The fluorescent material or the light-diffusing material that is included in the light-transmitting member 70 can be the same material as the fluorescent material or the light-diffusing material included in the first light-transmitting layer 31 or the second light-transmitting layer 32 described above.

The light-transmitting member 70 is located below the second light-transmitting layer 32 straddling over the adjacent second light-emitting elements 21. In the light-emitting device 4 shown in FIG. 6, the light-transmitting member 70 (a second portion 70b) is located between the longitudinal-direction end of the second light-emitting element 21A and the longitudinal-direction end of the second light-emitting element 21B in a top view. The light-transmitting members 70 (the second portions 70b) are located at the corner portions of the second light source part 20 that includes the plurality of second light-emitting elements 21 in a top view. The light-transmitting member 70 also may be located below each first light-transmitting layer 31 and each second light-transmitting layer 32. In the light-emitting device 4 according to the fourth embodiment, the upper surface of the light-transmitting member 70 contacts the lower surface of the first light-transmitting layer 31 or the second light-transmitting layer 32. The light-transmitting member 70 contacts the lower surface of the first light-transmitting layer 31 or the second light-transmitting layer 32 and includes a first portion 70a having the same planar size as the second light-transmitting layer 32. Also, the light-transmitting member 70 that is located below the second light-transmitting layer 32 straddling over the adjacent second light-emitting elements 21 includes the second portion 70b that is positioned below the first portion 70a, has a smaller planar size than the first portion 70a, and includes a side surface facing one side surface 21c of the second light-emitting element 21. The second light-transmitting layer 32 and the second portion 70b shown in FIG. 6 each are rectangular in a top view. In a top view, the second portion 70b includes two side surfaces respectively facing the side surfaces 21c of the adjacent second light-emitting elements 21, and two other side surfaces. The two other side surfaces of the second portion 70b are aligned with the two side surfaces of the second light-transmitting layer 32 in a top view. The corner at which the two other side surfaces of the second portion 70b cross is aligned with one corner portion of the second light-transmitting layer 32. The first portion 70a and the second portion 70b are one continuous object. In FIG. 7, the bonding member 50 covers the lower surface of the first portion 70a and a portion of the side surface of the second portion 70b. Also, portions of the lower surface and side surface of the second portion 70b are covered with the light-reflective member 60.

By providing the light-transmitting member 70 below the second light-transmitting layer 32 straddling over the adjacent second light-emitting elements 21, the decrease of the luminance between the second light-emitting element 21 can be reduced, and the uneven irradiation of the light-emitting device 4 can be reduced. Specifically, a portion of the light emitted from the side surface 21c of each of the adjacent second light-emitting elements 21 propagates through the second portion 70b of the light-transmitting member 70 and is scattered by a light-diffusing material inside the light-transmitting member 70, etc. Then, the light that propagates through the light-transmitting member 70 is extracted outside the light-emitting device 4 via the second light-transmitting layer 32 positioned above the light-transmitting member 70. The decrease of the luminance between the second light-emitting elements 21 can be reduced thereby, and the uneven irradiation of the light-emitting device 4 can be reduced.

The plurality of second light-emitting elements 21 include a second light-emitting element 21 on which at least two second light-transmitting layers 32 are located with the bonding member 50 interposed. For example, FIG. 7 shows the second light-emitting element 21A, and the second light-emitting element 21B adjacent to the second light-emitting element 21A. The plurality of second light-transmitting layers 32 located above the second light-emitting element 21A and the second light-emitting element 21B also are called third light-transmitting layers 32A for differentiation from the second light-transmitting layers 32 straddling the adjacent second light-emitting element 21A and second light-emitting element 21B.

Figure 7:
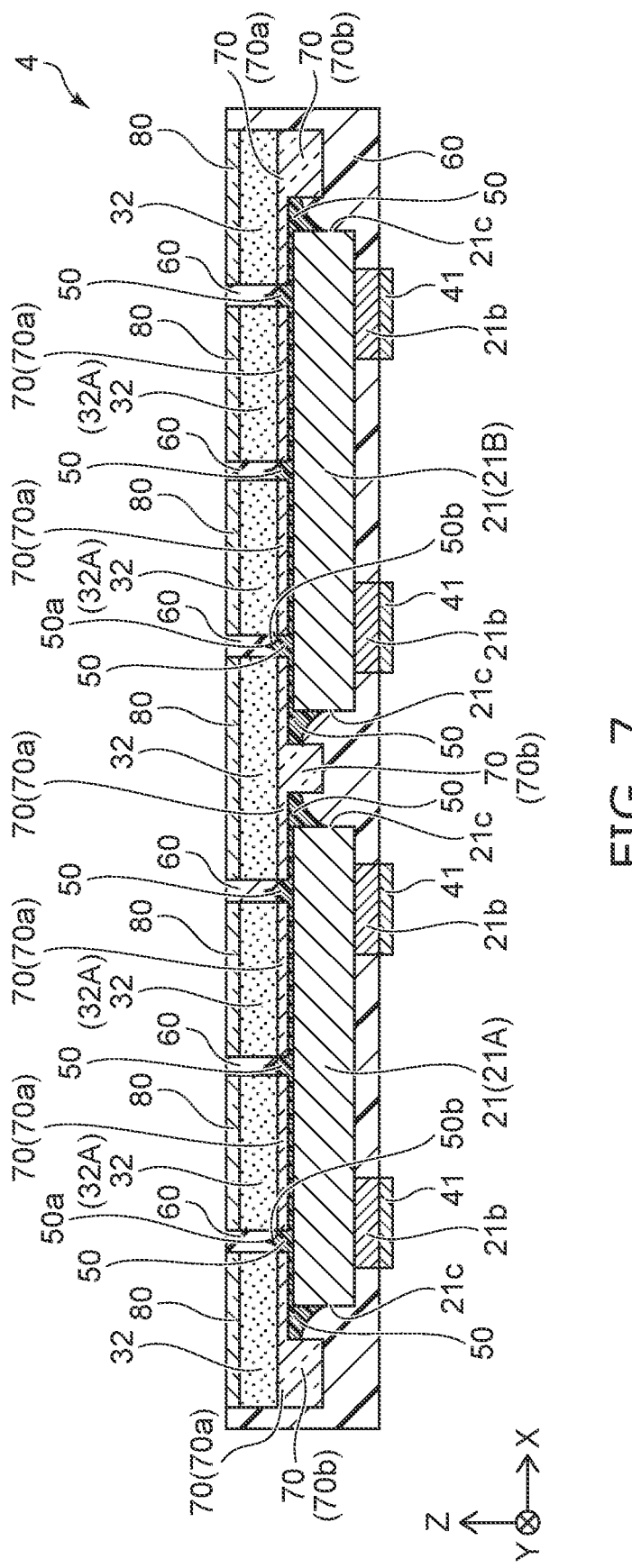
FIG. 7 is a schematic cross-sectional view along line VII-VII of FIG. 6.

As shown in FIG. 7, the transparent bonding member 50 is located between the second light-emitting element 21 and the second light-transmitting layer 32. Specifically, the bonding member 50 is located between the lower surface of the first portion 70a and the upper surface of the second light-emitting element 21 and contacts the lower surface of the first portion 70a and the upper surface of the second light-emitting element 21. The bonding member 50 contacts and continuously covers portions of the upper surface and side surface of the second light-emitting element 21 and the lower surfaces of at least two first portions 70a. By providing the bonding member 50 between the second light-emitting element 21 and the second light-transmitting layer 32, the bonding strength between the second light-emitting element 21 and the second light-transmitting layer 32 can be increased. The bonding member 50 may contact and continuously cover the lower surfaces of at least two second light-transmitting layers 32 without providing the first portion 70*a* of the light-transmitting member 70 at the lower surfaces of the second light-transmitting layers 32.

A portion of the transparent bonding member 50 is located between the at least two second light-transmitting layers 32 (third light-transmitting layers 32A) positioned on one second light-emitting element 21 below the light-reflective member 60 between the adjacent second light-transmitting layers 32 (third light-transmitting layers 32A). In other words, the light-reflective member 60 and the transparent bonding member 50 are positioned between at least two second light-transmitting layers 32 (third light-transmitting layers 32A) on one second light-emitting element 21. Compared to when only the light-reflective member 60 is located between the second light-transmitting layers 32 (the third light-transmitting layers 32A), by providing a portion of the bonding member 50 below the light-reflective member 60, the volume of the light-reflective member 60 between the second light-transmitting layers 32 (the third light-transmitting layers 32A) is reduced, and the decrease of the luminance between the second light-transmitting layers 32 (the third light-transmitting layers 32A) is suppressed. The uneven irradiation of the light-emitting device 4 can be reduced thereby.

The portion of the bonding member 50 between the adjacent second light-transmitting layers 32 includes a tip portion 50*a*, and a bonding member surface 50*b* that is continuous with the tip portion 50*a* and widens downward from the tip portion 50*a*. The tip portion 50*a* is positioned inside the light-reflective member 60 and does not reach the light-emitting surface of the light-emitting device 4. The bonding member surface 50*b* is positioned between the adjacent second light-transmitting layers 32, and a portion of the light-reflective member 60 is located between the bonding member surface 50*b* and the second light-transmitting layer 32.

The light-emitting device 4 can further include a light-diffusing layer 80 located on the upper surface of each of the plurality of second light-transmitting layers 32. The light-diffusing layer 80 is transparent to the light emitted by the first light-emitting element 11 and the light emitted by the second light-emitting element 21. For example, the light-diffusing layer 80 includes a resin and a light-diffusing material. The resin and the light-diffusing material that are included in the light-diffusing layer 80 can be the same materials as the resin and the light-diffusing material of the first light-transmitting layer 31 described above or the second light-transmitting layer 32. By providing the light-diffusing layer 80 on the upper surface of the second light-transmitting layer 32, the light can be diffused inside the light-diffusing layer 80, and the uneven irradiation of the light-emitting device 4 can be reduced. The light-diffusing layer 80 also may be located on the upper surface of each first light-transmitting layer 31.

Light-Emitting Module

Figure 8:
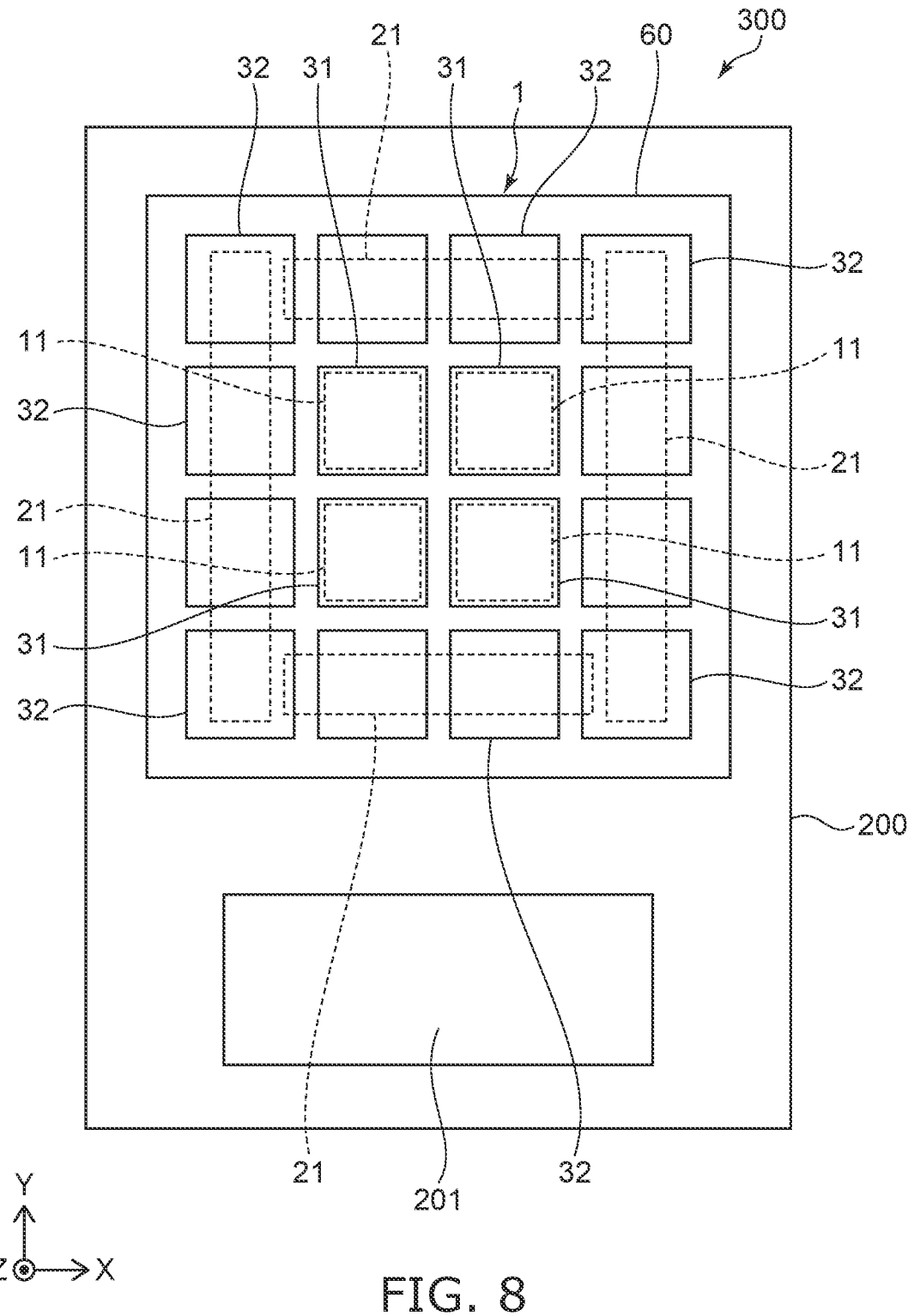
FIG. 8 is a schematic top view of a light-emitting module of an embodiment.

A light-emitting module that includes the light-emitting device according to the embodiment will now be described. The light-emitting module 300 shown in FIG. 8 includes the light-emitting device 1 according to the first embodiment as an illustration. The light-emitting module 300 may include the light-emitting device 2 according to the second embodiment, the light-emitting device 3 according to the third embodiment, or the light-emitting device 4 according to the fourth embodiment. The light-emitting module 300 further includes a substrate 200 and the light emission controller

201. The light-emitting device 1 and the light emission controller 201 are located on the substrate 200. The light emission controller 201 is a semiconductor component that includes a semiconductor integrated circuit. The light emission controller 201 is, for example, an IC driver.

The lower surface of the electrode 11*b* of the first light-emitting element 11 and the lower surface of the electrode 21*b* of the second light-emitting element 21 are bonded to a wiring part on the substrate 200 via a conductive bonding member such as, for example, solder, etc. It is preferable for metal films 41 shown in FIG. 2A to be located at the lower surface of the electrode 11*b* and the lower surface of the electrode 21*b*. The metal films 41 include, for example, gold films, and nickel films located between the electrodes 11*b* and 21*b* and the gold films. The gold films protect the electrodes 11*b* and 21*b* from corrosion and oxidization. The nickel films increase the adhesion between the electrodes 11*b* and 21*b* and the gold films.

The light emission controller 201 is electrically connected with the electrode 11*b* of the first light-emitting element 11 and the electrode 21*b* of the second light-emitting element 21 via the wiring part located on the substrate 200. The light emission controller 201 controls the light emission of the light source 100. The light emission controller 201 can collectively control all of the plurality of second light-emitting elements 21 included in the second light source part 20. The light emission controller 201 can collectively control all of the plurality of first light-emitting elements 11. Also, the light emission controller 201 can individually control each first light-emitting element 11.

Figure 9:
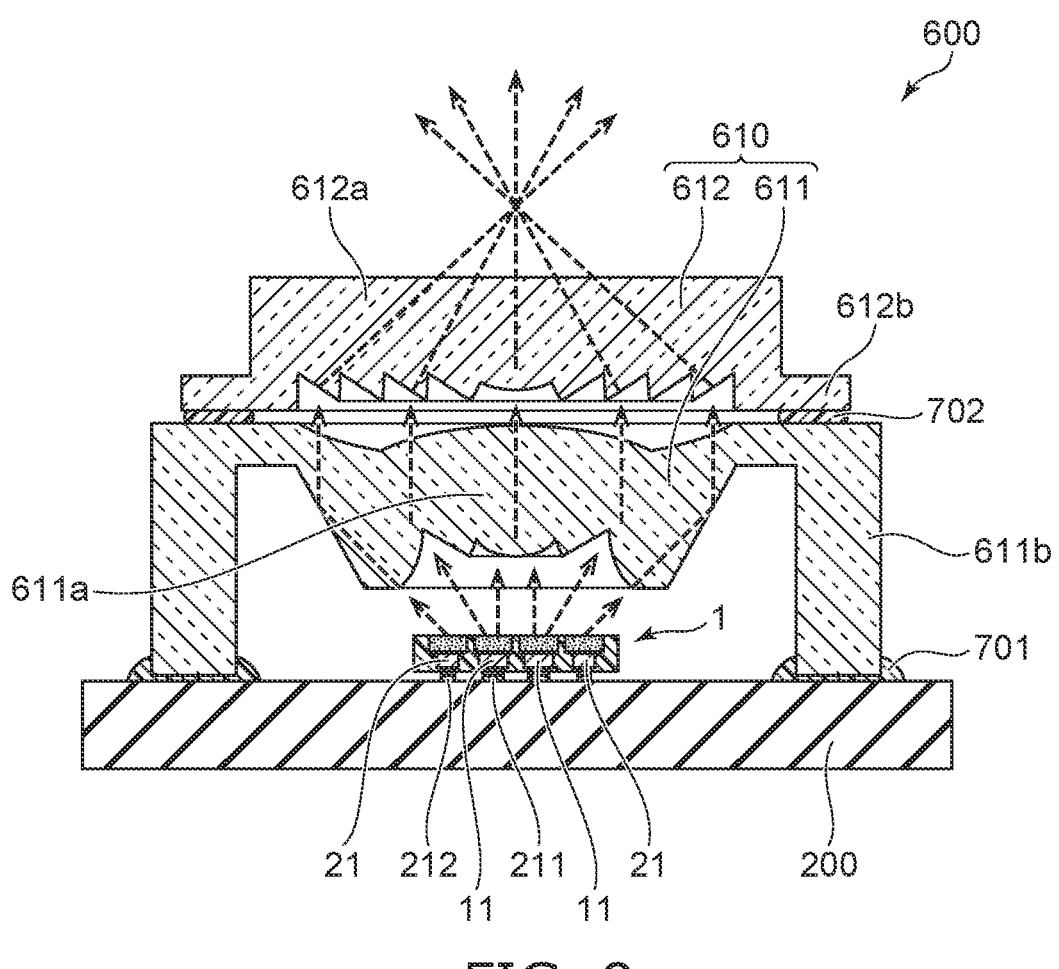
FIG. 9 is a schematic cross-sectional view of a light-emitting module of an embodiment.

A light-emitting module 600 that further includes a lens 610 will now be described with reference to FIG. 9. FIG. 9 is a schematic cross-sectional view showing the light-emitting module 600.

The light-emitting module 600 includes, for example, the light-emitting device 1 according to the first embodiment. The light-emitting module 600 may include the light-emitting device 2 of the second embodiment, the light-emitting device 3 of the third embodiment, or the light-emitting device 4 of the fourth embodiment.

A first wiring part 211 and a second wiring part 212 are located at the upper surface of the substrate 200. The electrode 11*b* of the first light-emitting element 11 is bonded to the first wiring part 211, and the electrode 21*b* of the second light-emitting element 21 is bonded to the second wiring part 212. The light emission controller 201 described above is located on the substrate 200.

In the light-emitting module 600, the lens 610 includes a first lens member 611 and a second lens member 612. The first lens member 611 includes a first lens part 611*a*, and a first outer perimeter part 611*b* positioned outward of the first lens part 611*a*. For example, the first outer perimeter part 611*b* is fixed to the upper surface of the substrate 200 by a bonding member 701. The first lens part 611*a* faces the light-emitting surface of the light-emitting device 1. The second lens member 612 includes a second lens part 612*a*, and a second outer perimeter part 612*b* positioned outward of the second lens part 612*a*. For example, the second outer perimeter part 612*b* is fixed to the upper surface of the first outer perimeter part 611*b* of the first lens member 611 by a bonding member 702. The second lens part 612*a* faces the upper surface of the first lens part 611*a*.

The major trajectories of the light emitted from the light-emitting device 1 are illustrated by broken line arrows in FIG. 9. For example, the first lens member 611 changes the light from the light-emitting device 1 into parallel light, and the second lens member 612 condenses or diffuses the light from the first lens member 611.

There are cases where a portion of the light from the light-emitting elements positioned at the outer side of the light-emitting device leaks outside the lens without entering the lens. On the other hand, according to the first, second, or fourth embodiment described above, the luminance of the second light source part 20 that includes the second light-emitting elements 21 can be increased by increasing the planar size of the second light-emitting element 21 positioned at the outer side. Thereby, sufficient light from the second light source part 20 can enter the first lens part 611*a* and the second lens part 612*a* even when a portion of the light from the second light-emitting elements 21 does not enter the first lens part 611*a* and the second lens part 612*a*.

A method for manufacturing the light-emitting device 4 of the fourth embodiment will now be described with reference to FIGS. 10A to 10I as an example of the method for manufacturing the light-emitting device of the embodiment. FIGS. 10A to 10I are cross-sectional views corresponding to the cross section of line VII-VII of FIG. 6.

Figure 10A:
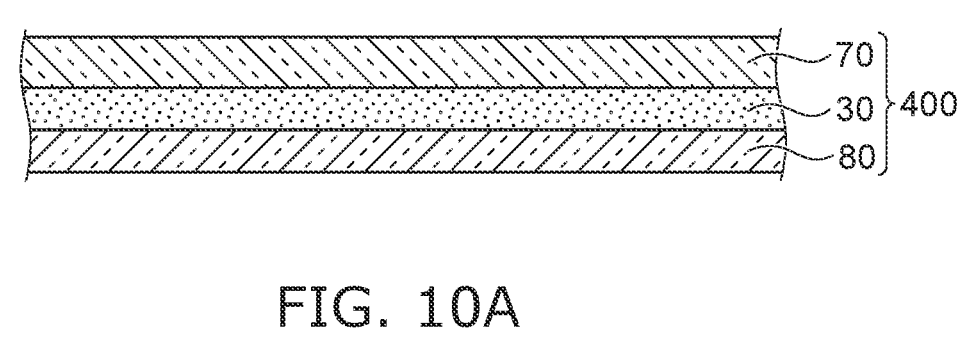
FIGS. 10A to 10I each are schematic cross-sectional views for describing one process of a method for manufacturing the light-emitting device of the fourth embodiment.

First, a structure body 400 is prepared as shown in FIG. 10A. The structure body 400 includes the light-diffusing layer 80, a light-transmitting layer 30 located on the light-diffusing layer 80, and the light-transmitting member 70 located on the light-transmitting layer 30.

Figure 10B:
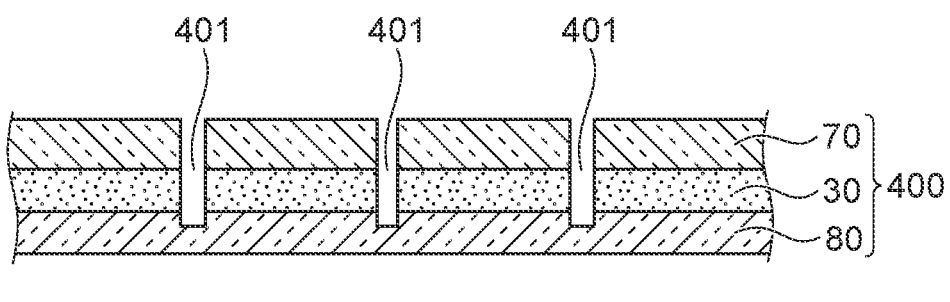
Figure 10B:
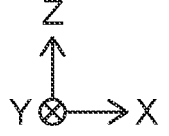

Then, as shown in FIG. 10B, a plurality of trenches 401 are formed in the structure body 400. The trenches 401 extend through the light-transmitting member 70 and the light-transmitting layer 30 from the upper surface of the light-transmitting member 70 and reach the light-diffusing layer 80. The plurality of trenches 401 are formed along the first and second directions X and Y when the structure body 400 is viewed from above. For example, the trenches 401 are formed by a dicing blade or a laser. The light-transmitting member 70 and the light-transmitting layer 30 are divided into a plurality of portions by the trenches 401. The light-diffusing layer 80 is one continuous layer from which portions of the upper surface are removed. The plurality of portions of the light-transmitting layer 30 separated by the plurality of trenches 401 include portions used to form the first light-transmitting layers 31 and portions used to form the second light-transmitting layers 32.

Figure 10C:
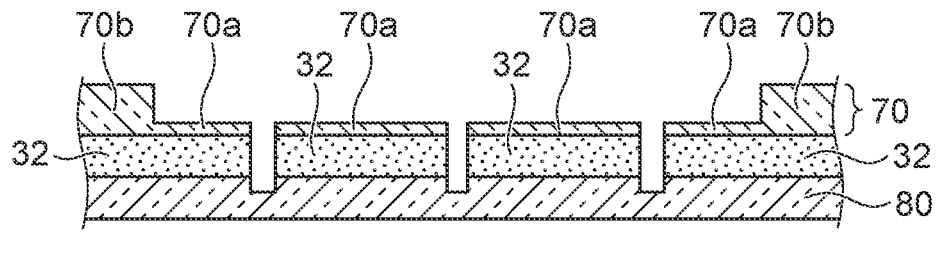
Figure 10C:
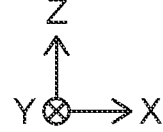

Continuing, a portion of the light-transmitting member 70 is removed in the region in which the first light-emitting elements 11 will be located and the region in which the second light-emitting elements 21 will be located. Thereby, as shown in FIG. 10C, the first portion 70*a* and the second portion 70*b* positioned above the first portion 70*a* are formed in the light-transmitting member 70. That is, in the process of removing the portion of the light-transmitting member 70, in the region in which the second light-emitting elements 21 will be located, the removal process is performed so that the first portion 70*a* remains on the second light-transmitting layer 32 so that the light-transmitting member 70 is not removed until the second light-transmitting layer 32 is exposed. Fluctuation of the light emission color of the light-transmitting layer caused by fluctuation of the thickness of the second light-transmitting layer 32 due to a portion of the second light-transmitting layer 32 being removed can be prevented thereby. Similarly, for the first light-transmitting layer 31 as well, in the process of removing the portion of the light-transmitting member 70, the removal process is performed so that the first portion 70*a* remains on the first light-transmitting layer 31 without removing the light-transmitting member 70 until the first light-transmitting layer 31 is exposed in the region in which the first light-emitting elements 11 will be located. Fluctuation of the light emission color of the light-transmitting layers caused by fluctuation of the thickness of the first light-transmitting layer 31 can be prevented thereby. For example, the process of removing the portion of the light-transmitting member 70 is performed using a dicing blade.

Figure 10D:
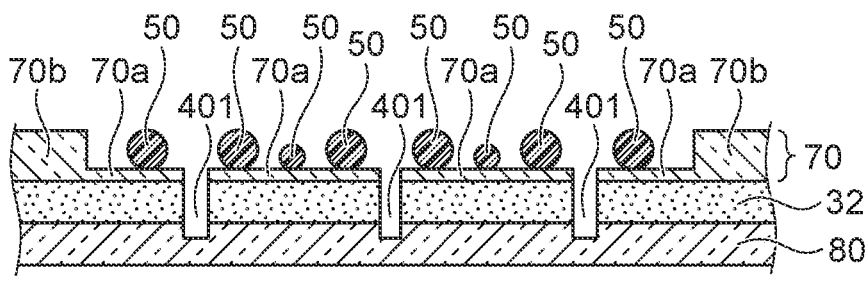
Figure 10D:
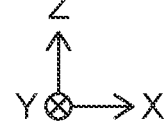

Then, as shown in FIG. 10D, the bonding member 50 is supplied in an uncured state onto the first portion 70*a* in the region in which the second light-emitting elements 21 will be located. Also, the bonding member 50 is supplied in an uncured state onto the first portion 70*a* in the region in which the first light-emitting elements 11 will be located. The bonding member 50 is transparent. The bonding member 50 in the uncured state is supplied to the first portion 70*a* from above by, for example, a dispenser. In the process of supplying the bonding member 50 in the uncured state, the amount of the bonding member 50 supplied to positions relatively distant to the trench 401 may be greater than the amount of the bonding member 50 supplied to positions relatively proximate to the trench 401. The amount of the bonding member 50 entering the trench 401 can be increased thereby, and the volume of the light-reflective member 60 entering between the second light-transmitting layers 32 in a subsequent process can be reduced.

Figure 10E:
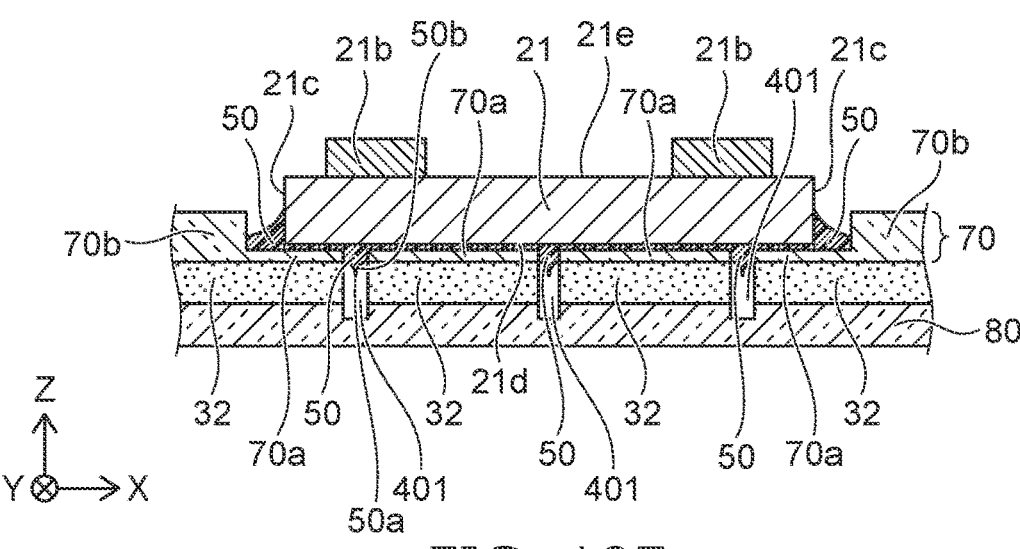

Continuing as shown in FIG. 10E, the second light-emitting elements 21 are disposed in the region facing the second light-transmitting layers 32. Also, the first light-emitting elements 11 are disposed in the regions facing the first light-transmitting layers 31. The bonding member 50 is cured after disposing the first light-emitting elements 11 and the second light-emitting elements 21. For example, the process of curing the bonding member 50 is performed by heating. Thereby, the first light-emitting element 11 and the first light-transmitting layer 31 are bonded via the bonding member 50, and the second light-emitting element 21 and the second light-transmitting layer 32 are bonded via the bonding member 50.

The bonding member 50 after curing covers the upper surface (the surface at the side opposite to the surface at which the electrode 11*b* is located) and a portion of the side surface of the first light-emitting element 11 and an upper surface 21*d* (the surface at the side opposite to a surface 21*e* at which the electrode 21*b* is located) and a portion of the side surface 21*c* of the second light-emitting element 21. The bonding member 50 also covers the upper surface of the first portion 70*a* and a portion of the side surface of the second portion 70*b* of the light-transmitting member 70. A portion of the bonding member 50, which has fluidity in the uncured state, is pushed out by the second light-emitting element 21 and enters the trench 401. Therefore, the bonding member 50 after curing also is located inside the trench 401 between the adjacent second light-transmitting layers 32. The bonding member 50 that is located inside the trench 401 is cured in a state of hanging downward to form the tip portion 50*a* and the bonding member surface 50*b* that is continuous with the tip portion 50*a* and has an increasing width. According to the embodiment, the bonding member 50 that is located on the first light-transmitting layer 31 is not located inside the trench 401. The bonding member 50 that is located on the first light-transmitting layer 31 also may be located in a portion inside the trench 401.

Figure 10F:
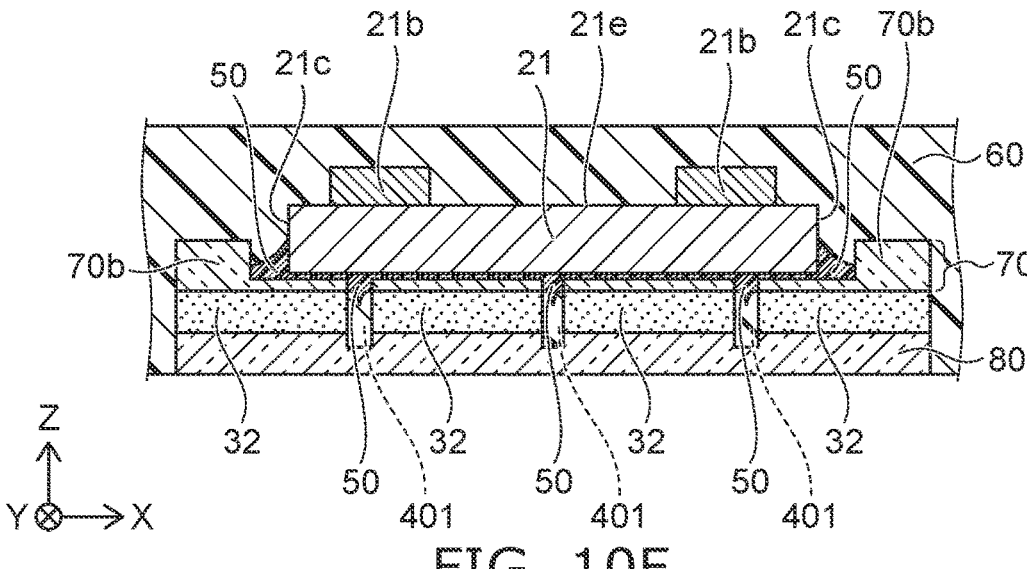

Then, the light-reflective member 60 is formed as shown in FIG. 10F. For example, the light-reflective member 60 is formed using a mold to perform transfer molding, injection molding, compression molding, etc. The light-reflective member 60 covers the lower surface and a portion of the side surface of the first light-emitting element 11 and the lower surface 21e and a portion of the side surface 21c of the second light-emitting element 21. The electrode 11b that is positioned at the lower surface of the first light-emitting element 11 and the electrode 21b that is positioned at the lower surface 21e of the second light-emitting element 21 are surrounded with the light-reflective member 60. The light-reflective member 60 covers a portion of the bonding member 50 and the upper surface and a portion of the side surface of the second portion 70b of the light-transmitting member 70. The light-reflective member 60 covers the side surface of the first light-transmitting layer 31, the side surface of the second light-transmitting layer 32, and the side surface of the light-diffusing layer 80. Also, a portion of the light-reflective member 60 is located inside the trench 401 between the adjacent first light-transmitting layers 31 and inside the trench 401 between the adjacent second light-transmitting layers 32. Inside the trench 401 between the second light-transmitting layers 32, the transparent bonding member 50 is positioned at the opening side of the trench 401, and the light-reflective member 60 is positioned at the bottom side of the trench 401. For example, the light-reflective member 60 passes through the trench 401 between the first light-transmitting layers 31 and enters the trench 401 below the bonding member 50.

Figure 10G:
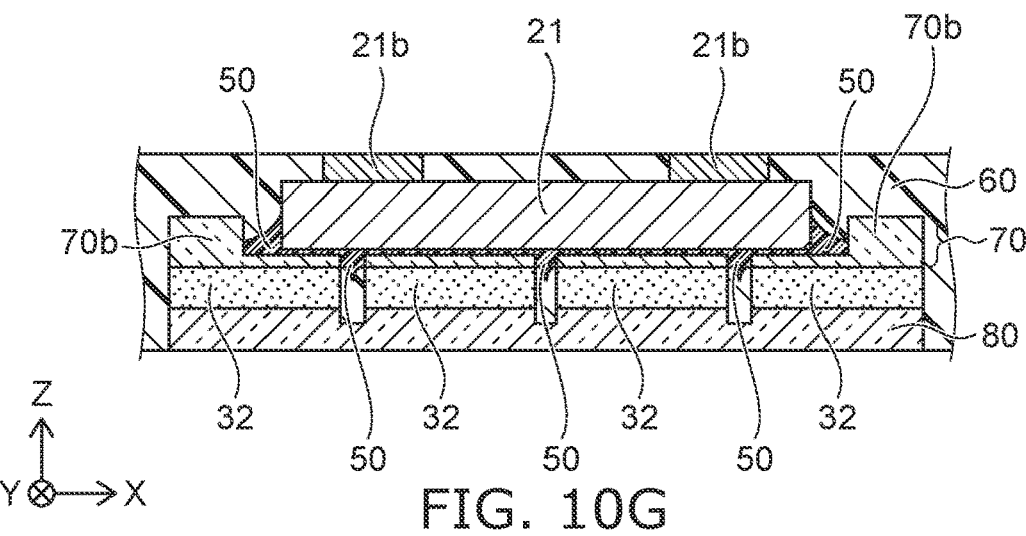

Continuing as shown in FIG. 10G, the surface of the electrode 21b of the second light-emitting element 21 and the surface of the electrode 11b of the first light-emitting element 11 are exposed from under the light-reflective member 60 by removing a portion of the surface of the light-reflective member 60 from the upper surface side. For example, the process of removing the light-reflective member 60 is performed using a polishing device.

Figure 10H:
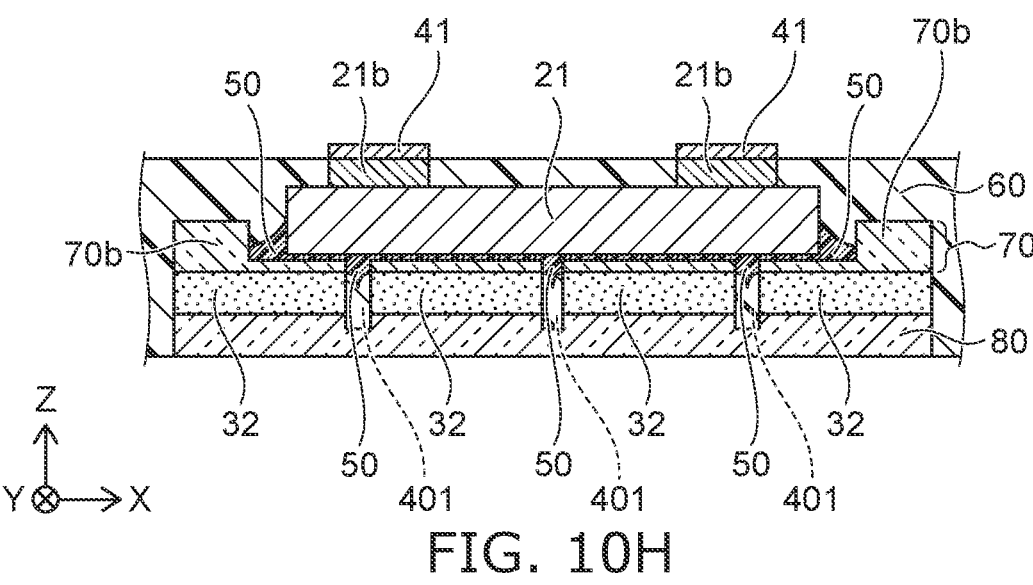

Then, as shown in FIG. 10H, the metal films 41 are formed on the surfaces of the electrodes 11b and 21b not covered with the light-reflective member 60. For example, a nickel film and a gold film are stacked in this order from the electrode side as the metal film 41. For example, the metal film 41 is formed by sputtering or vapor deposition.

Figure 10I:
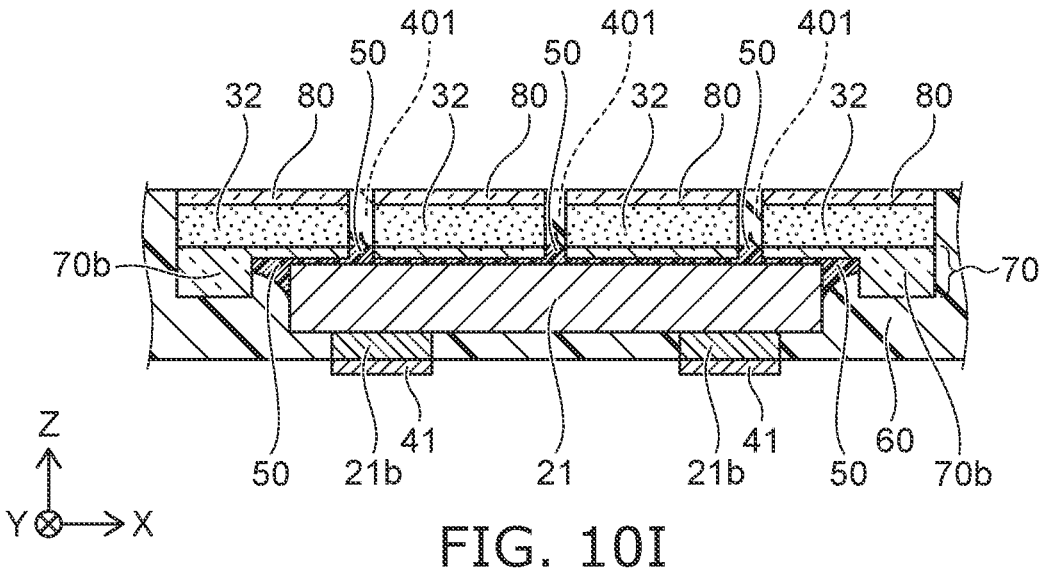

Continuing as shown in FIG. 10I, vertical inversion is performed so that the light-diffusing layer 80 is at the upper surface side, and a portion of the light-diffusing layer 80 and a portion of the light-reflective member 60 are removed. Thereby, the light-diffusing layer 80 is divided into a plurality of portions at the positions of the trenches 401. For example, the removal of the light-diffusing layer 80 and the like is performed using a polishing device. For example, the processes up to this point are performed in a state in which the plurality of regions that will become the light-emitting devices 4 are linked together. The linked plurality of regions of the light-emitting devices 4 are cut using a dicing blade, etc., to form the individual light-emitting devices 4. The singulated plurality of light-emitting devices 4 can be obtained thereby.

A method for manufacturing the light-emitting device 4 according to a modification of the fourth embodiment will now be described with reference to FIGS. 11A to 11D. The configuration of the light-transmitting member 70 according to the method for manufacturing the light-emitting device 4 according to the modification of the fourth embodiment is different from that of the method for manufacturing the light-emitting device 4 according to the fourth embodiment. FIGS. 11A to 11D are cross-sectional views corresponding to the cross section of line VII-VII of FIG. 6.

Figure 11A:
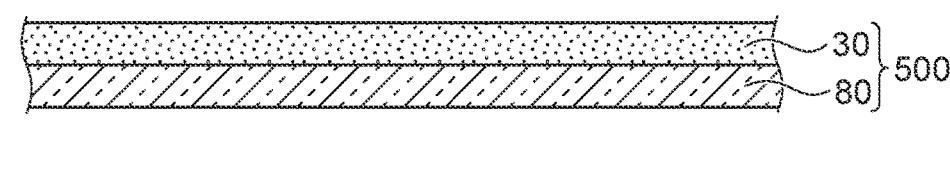
FIGS. 11A to 11D each are schematic cross-sectional views for describing one process of a method for manufacturing a light-emitting device according to a modification of the fourth embodiment.
Figure 11A:
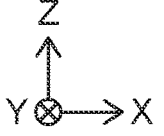

First, a structure body 500 is prepared as shown in FIG. 11A. The structure body 500 includes the light-diffusing layer 80, and the light-transmitting layer 30 located on the light-diffusing layer 80.

Figure 11B:
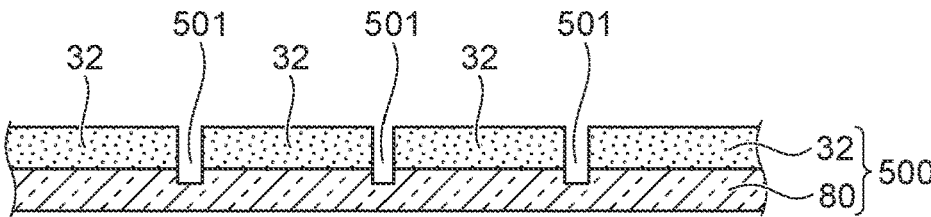
Figure 11B:
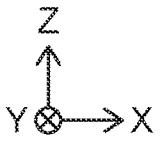

Then, as shown in FIG. 11B, a plurality of trenches 501 are formed in the structure body 500. The trenches 501 extend through the light-transmitting layer 30 from the upper surface of the light-transmitting layer 30 and reach the light-diffusing layer 80. The plurality of trenches 501 are formed along the first and second directions X and Y when the structure body 500 is viewed from above. For example, the trenches 501 are formed by a dicing blade or a laser. The light-transmitting layer 30 is divided into a plurality of portions by the trenches 501. The light-diffusing layer 80 is one continuous layer from which portions of the upper surface are removed. The plurality of portions of the light-transmitting layer 30 separated by the plurality of trenches 501 include portions used to form the first light-transmitting layers 31 and portions used to form the second light-transmitting layers 32.

Figure 11C:
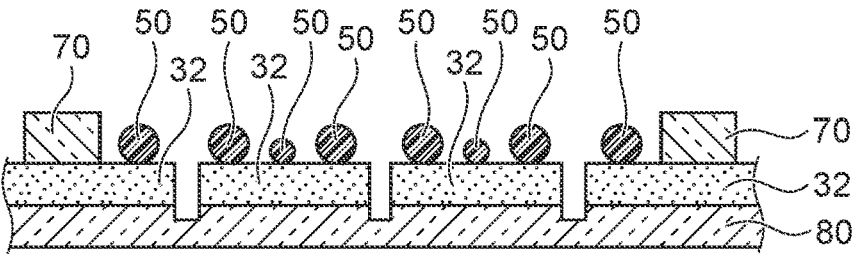
Figure 11C:
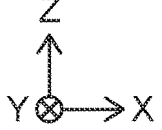

Continuing as shown in FIG. 11C, the light-transmitting member 70 in the uncured state is disposed on the second light-transmitting layer 32 straddling over the adjacent second light-emitting elements 21 described above. Specifically, as in FIG. 6, the light-transmitting member 70 in the uncured state is disposed on the second light-transmitting layer 32 straddling over the adjacent second light-emitting elements 21. For example, the light-transmitting member 70 is positioned within the second light-transmitting layer 32 in a top view. For example, the light-transmitting member 70 in the uncured state is supplied by a dispenser. A pre-solidified light-transmitting member 70 may be disposed on the second light-transmitting layer 32.

Also, the bonding member 50 in the uncured state is supplied onto the second light-transmitting layers 32 in the region in which the second light-emitting elements 21 will be located. The bonding member 50 in the uncured state is supplied onto the first light-transmitting layers 31 in the region in which the first light-emitting elements 11 will be located. The bonding member 50 is transparent. For example, the bonding member 50 in the uncured state is supplied to the first and second light-transmitting layers 31 and 32 from above by using a dispenser.

Figure 11D:
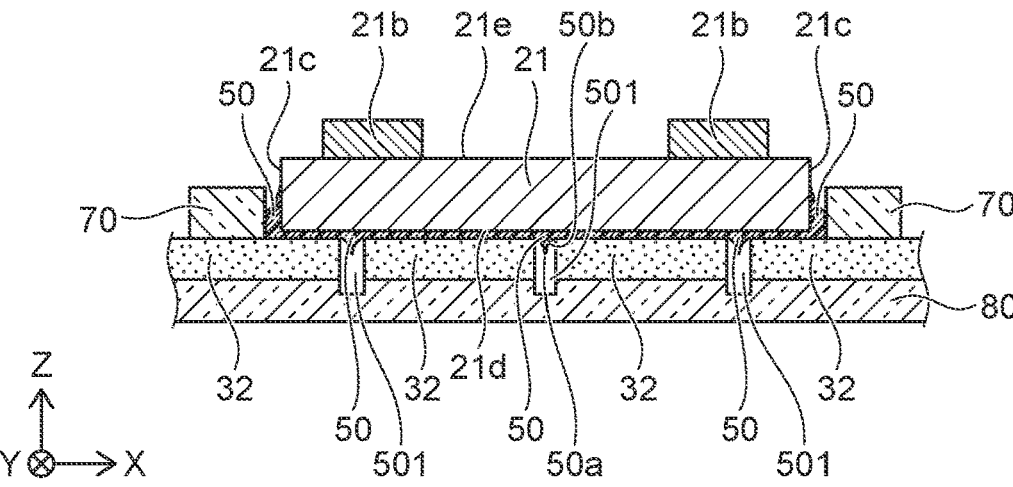

Then, as shown in FIG. 11D, the second light-emitting element 21 is disposed in the region facing the second light-transmitting layer 32. The first light-emitting element 11 is disposed in the region facing the first light-transmitting layer 31. The bonding member 50 is cured after disposing the first light-emitting element 11 and the second light-emitting element 21. When the light-transmitting member 70 in the uncured state is used as the light-transmitting member 70, the bonding member 50 and the light-transmitting member 70 may be simultaneously cured. For example, the process of curing the bonding member 50 or the light-transmitting member 70 is performed by heating. Thereby, the first light-emitting element 11 and the first light-transmitting layer 31 are bonded via the bonding member 50, and the second light-emitting element 21 and the second light-transmitting layer 32 are bonded via the bonding member 50. According to the method for manufacturing the light-emitting device 4 according to the modification of the fourth embodiment, the light-transmitting member 70 is not located between the first light-emitting element 11 and the first light-transmitting layer 31 and between the second light-emitting element 21 and the second light-transmitting layer 32.

The bonding member 50 after curing covers the upper surface and a portion of the side surface of the first light-emitting element 11 and the upper surface 21d and a portion of the side surface 21c of the second light-emitting element 21. The bonding member 50 also covers a portion of the side surface of the light-transmitting member 70. Also, a portion of the bonding member 50, which has fluidity in the uncured state, is pushed out by the second light-emitting element 21 and enters the trench 501. Therefore, the bonding member 50 after curing also is located inside the trench 501 between the adjacent second light-transmitting layers 32. By curing the bonding member 50 located inside the trench 501 in a state of hanging downward, the tip portion 50a is formed, and the bonding member surface 50b that is continuous with the tip portion 50a and has an increasing width is formed. According to the embodiment, the bonding member 50 that is located on the first light-transmitting layer 31 is not located inside the trench 501. The bonding member 50 that is located on the first light-transmitting layer 31 also may be located in a portion inside the trench 501.

Then, processes similar to those of FIGS. 10F to 10I above are continued. In the process of forming the light-reflective member 60, portions of the light-reflective member 60 are located inside the trench 501 between the adjacent first light-transmitting layers 31 and inside the trench 501 between the adjacent second light-transmitting layers 32. Inside the trench 501 between the second light-transmitting layers 32, the transparent bonding member 50 is positioned at the opening side of the trench 501, and the light-reflective member 60 is positioned at the bottom side of the trench 501. For example, the light-reflective member 60 passes through the trench 501 between the first light-transmitting layers 31 and enters the trench 501 below the bonding member 50.

Hereinabove, exemplary embodiments according to the disclosure are described with reference to specific examples. However, embodiments of the disclosure are not limited to these specific examples. All configurations practicable by an appropriate design modification by one skilled in the art based on the embodiments of the disclosure described above also are within the scope of the disclosure to the extent that the purport of the disclosure is included. Various other variations and modifications can be conceived by those skilled in the art within the spirit of the invention, and it is understood that such variations and modifications are also encompassed within the scope of the disclosure.

What is claimed is:

1. A light-emitting device comprising:
   a light source comprising:
      a first light source part comprising one or more first light-emitting elements, and
      a second light source part located outward of the first light source part so as to surround the first light source part in a top view, the second light source part comprising a plurality of second light-emitting elements;
   one or more first light-transmitting layers located above the first light source part;
   one or more second light-transmitting layers located above the second light source part; and
   a light-reflective member located between the plurality of second light-emitting elements, wherein:
   a first of the one or more second light-transmitting layers overlaps adjacent second light-emitting elements among the plurality of second light-emitting elements and the light-reflective member disposed between the adjacent second light-emitting elements in a top view, and
   a planar size of each of the plurality of second light-emitting elements is greater than a planar size of each of the one or more first light-emitting elements.

2. The light-emitting device according to claim 1, wherein:

the one or more second light-transmitting layers comprise at least three second light-transmitting layers, and
   the at least three second light-transmitting layers are arranged at uniform spacing in a top view.

3. The light-emitting device according to claim 1, wherein:
   the one or more second light-transmitting layers comprise a single second light-transmitting layer that overlaps surfaces of all of the plurality of second light-emitting elements in a top view.

4. The light-emitting device according to claim 1, further comprising:
   a light-transmitting member located between the adjacent second light-emitting elements below the first of the one or more second light-transmitting layers.

5. The light-emitting device according to claim 4, wherein:
   the light-transmitting member comprises a fluorescent material or a light-diffusing material.

6. The light-emitting device according to claim 1, wherein:
   a bonding member is located between the plurality of second light-emitting elements and the one or more second light-transmitting layers, and
   the bonding member is transparent.

7. The light-emitting device according to claim 6, wherein:
   the plurality of second light-emitting elements comprises an additional second light-emitting element other than the adjacent second light-emitting elements, and
   at least two of the second light-transmitting layers are located above the additional second light-emitting element with the bonding member interposed therebetween.

8. The light-emitting device according to claim 7, wherein:
   the light-reflective member also is located between the at least two second light-transmitting layers, and
   the bonding member is located below the light-reflective member between the at least two second light-transmitting layers while covering a side surface of the additional second light-emitting element.

9. A light-emitting module comprising:
   a light-emitting device comprising:
      a light source comprising:
         a first light source part comprising one or more first light-emitting elements, and
         a second light source part located outward of the first light source part so as to surround the first light source part in a top view, the second light source part comprising a plurality of second light-emitting elements;
      one or more first light-transmitting layers located above the first light source part;
      one or more second light-transmitting layers located above the second light source part; and
      a light-reflective member located between the plurality of second light-emitting elements,
      wherein a first of the one or more second light-transmitting layers overlaps adjacent second light-emitting elements among the plurality of second light-emitting elements and the light-reflective member disposed between the adjacent second light-emitting elements in a top view;
   a light emission controller configured to control light emission of the light source, wherein:

the light emission controller is configured to collectively control light emission of the plurality of second light-emitting elements of the second light source part.

10. A light-emitting device comprising:

a first light-emitting element;

a plurality of second light-emitting elements located at a periphery of the first light-emitting element, the plurality of second light-emitting elements being adjacent to each other;

a light-reflective member located between two of the second light-emitting elements;

a first light-transmitting layer located above the first light-emitting element; and a second light-transmitting layer located above the light-reflective member so as to overlap the two second light-emitting elements, wherein:

a planar size of each second light-emitting element is greater than a planar size of the first light-emitting element.

11. The light-emitting device according to claim 10, further comprising:

a light-transmitting member located between the two second light-emitting elements below the second light-transmitting layer.

12. The light-emitting device according to claim 11, wherein:

the light-transmitting member comprises a fluorescent material or a light-diffusing material.

13. The light-emitting device according to claim 10, wherein:

a bonding member is located between the plurality of second light-emitting elements and the second light-transmitting layer, and the bonding member is transparent.

14. The light-emitting device according to claim 13, wherein:

the light-emitting device further comprises a plurality of third light-transmitting layers, the plurality of second light-emitting elements include an additional second light-emitting element other than the two second light-emitting elements, and at least two of the third light-transmitting layers are located above the additional second light-emitting element with the bonding member interposed between the additional second light-emitting element and the at least two of the third light-transmitting layers.

15. The light-emitting device according to claim 14, wherein:

the light-reflective member also is located between the at least two third light-transmitting layers, and the bonding member is located below the light-reflective member between the at least two third light-transmitting layers while covering a side surface of the additional second light-emitting element.

16. A light-emitting module, comprising:

the light-emitting device according to claim 10; and a light emission controller configured to collectively control light emission of the plurality of second light-emitting elements.

* * * * *